United States Patent [19]
Shigehara et al.

[11] Patent Number: 5,880,603
[45] Date of Patent: Mar. 9, 1999

[54] MOS OUTPUT BUFFER WITH OVERVOLTAGE PROTECTION CIRCUITRY

[75] Inventors: Hiroshi Shigehara, Oita; Masanori Kinugasa, Yokohama, both of Japan

[73] Assignee: Kabushiki Kaisha Toshiba, Tokyo, Japan

[21] Appl. No.: 657,599

[22] Filed: May 31, 1996

[30] Foreign Application Priority Data

Jun. 2, 1995 [JP] Japan .................................. 7-136767

[51] Int. Cl.$^6$ .............................................. H03K 19/0185
[52] U.S. Cl. .................................. 326/81; 326/58; 326/83
[58] Field of Search .............................. 326/80–81, 83, 326/86, 121.27, 57–58; 327/534, 537; 361/91

[56] References Cited

U.S. PATENT DOCUMENTS

| | | | |
|---|---|---|---|
| 5,004,936 | 4/1991 | Andresen .................................. | 326/27 |
| 5,144,165 | 9/1992 | Dhong et al. . | |
| 5,381,061 | 1/1995 | Davis et al. . | |
| 5,396,128 | 3/1995 | Dunning et al. .......................... | 326/80 |
| 5,406,140 | 4/1995 | Wert et al. . | |
| 5,442,307 | 8/1995 | Shigehara et al. . | |
| 5,450,025 | 9/1995 | Shay ......................................... | 326/81 |
| 5,570,043 | 10/1996 | Churchill ................................. | 326/81 |
| 5,661,414 | 8/1997 | Shigehara et al. ........................ | 326/81 |

*Primary Examiner*—Jon Santamauro
*Attorney, Agent, or Firm*—Banner & Witcoff, Ltd.

[57] ABSTRACT

Either a power-supply potential or a ground potential is applied to a power-supply node through a switch. When a potential higher than the ground potential is applied to an output terminal while the power-supply node is connected to the ground-potential node, the potential of a back gate of a first PMOS transistor incorporated in an output section increases in accordance with the potential of the output terminal, due to a pn-junction provided between the drain and back gate of the first PMOS transistor. At this time, a second PMOS transistor whose source-drain path is connected between the back gate and gate of the first PMOS transistor is turned on, whereby the potential of the back gate of the first PMOS transistor is transferred to the gate thereof.

19 Claims, 18 Drawing Sheets

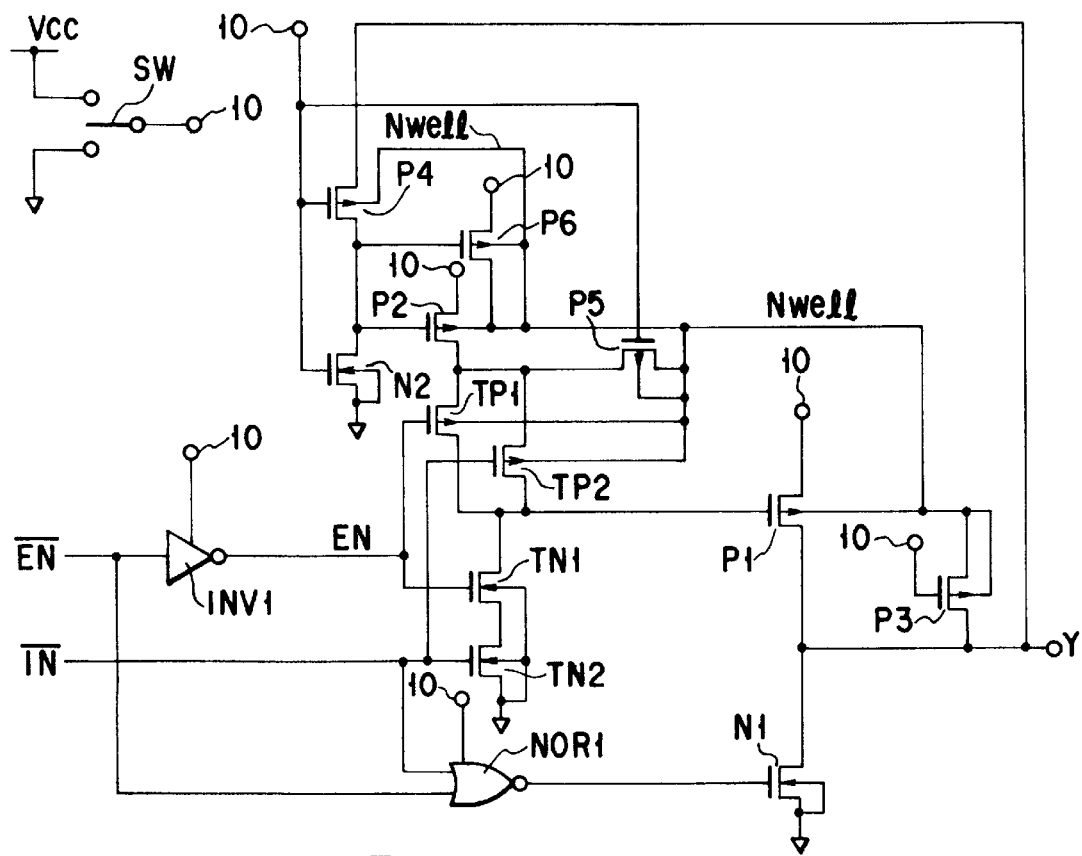
F I G. 7

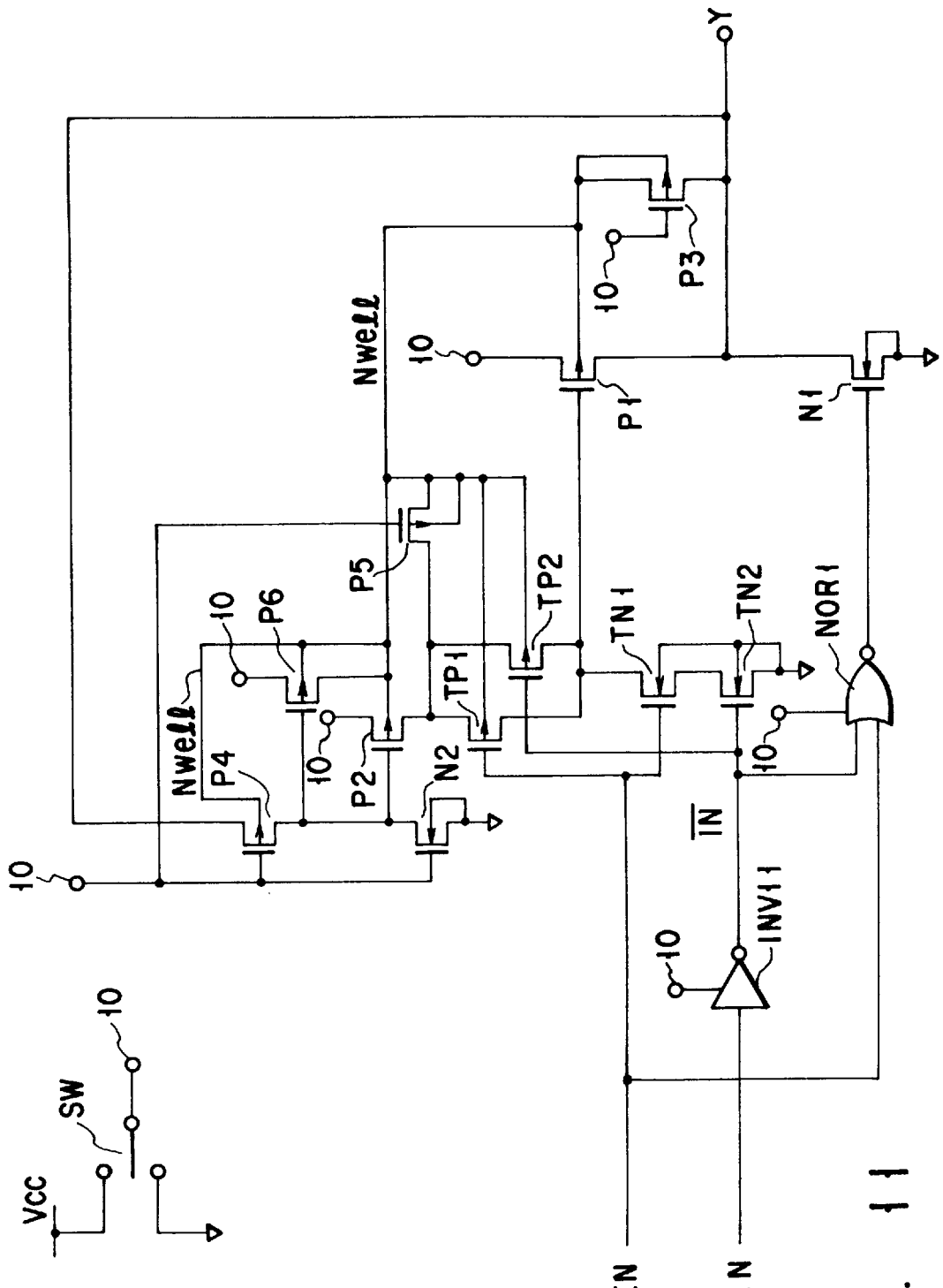
F I G. 11

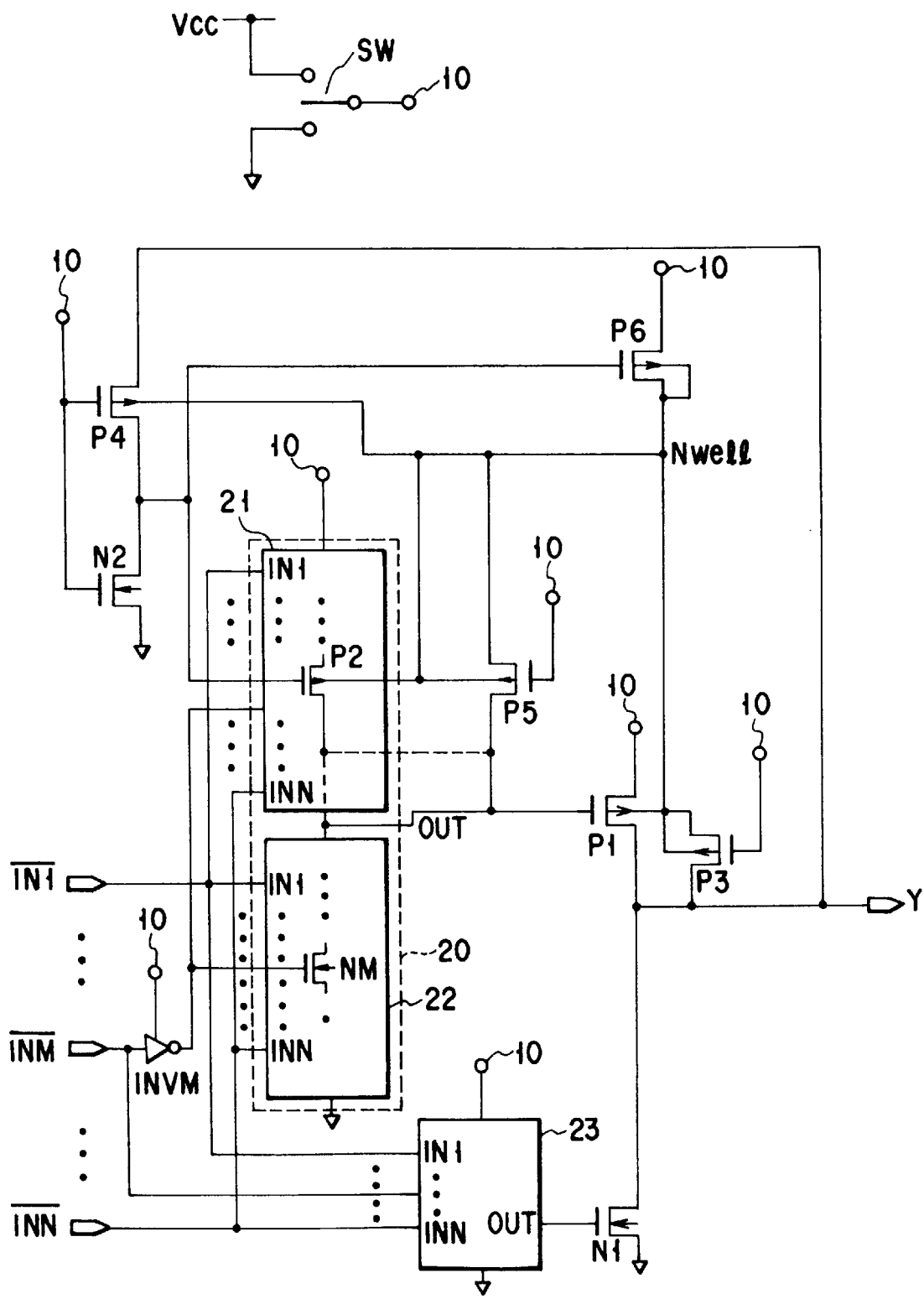
F I G. 13

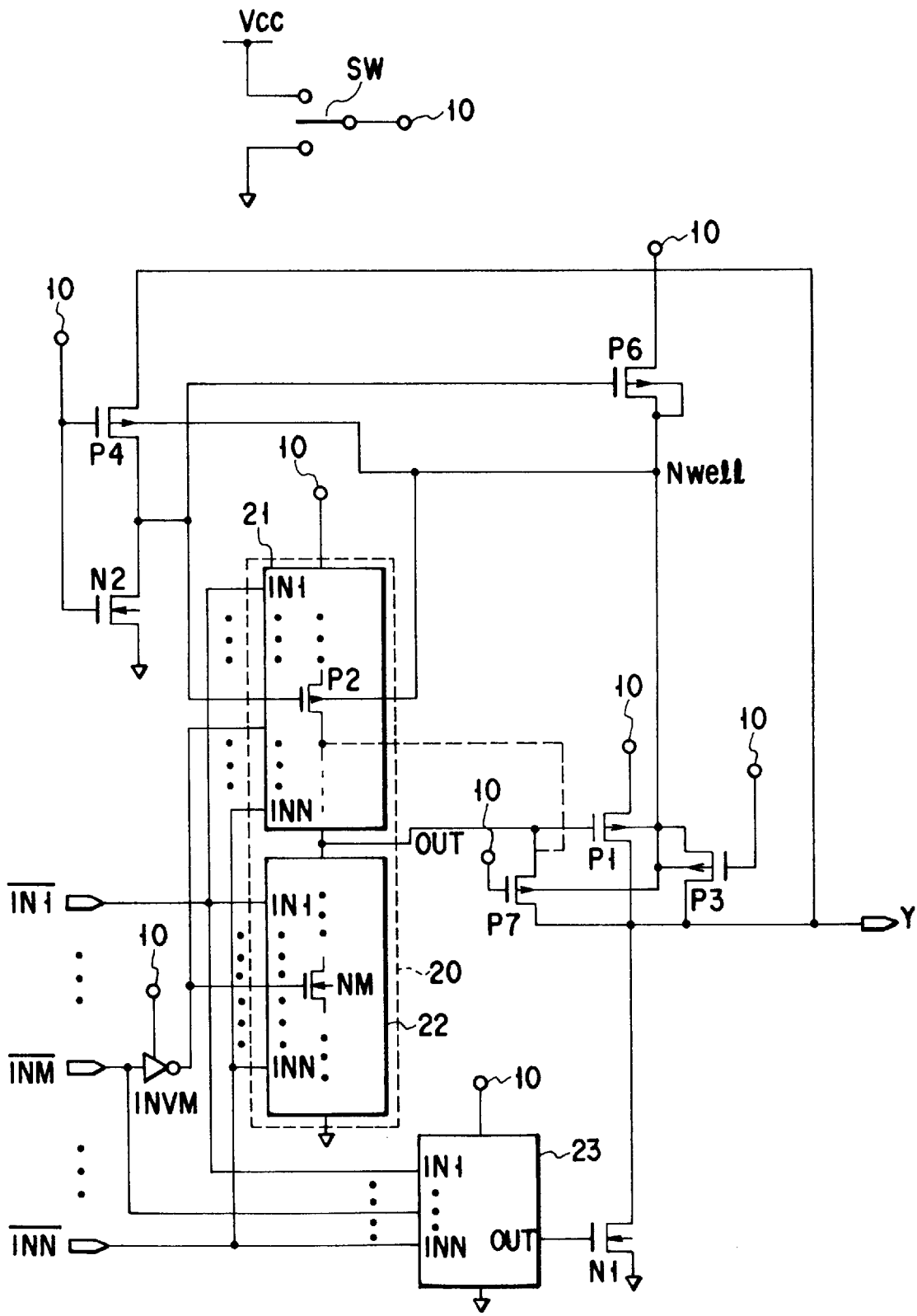
F I G. 14

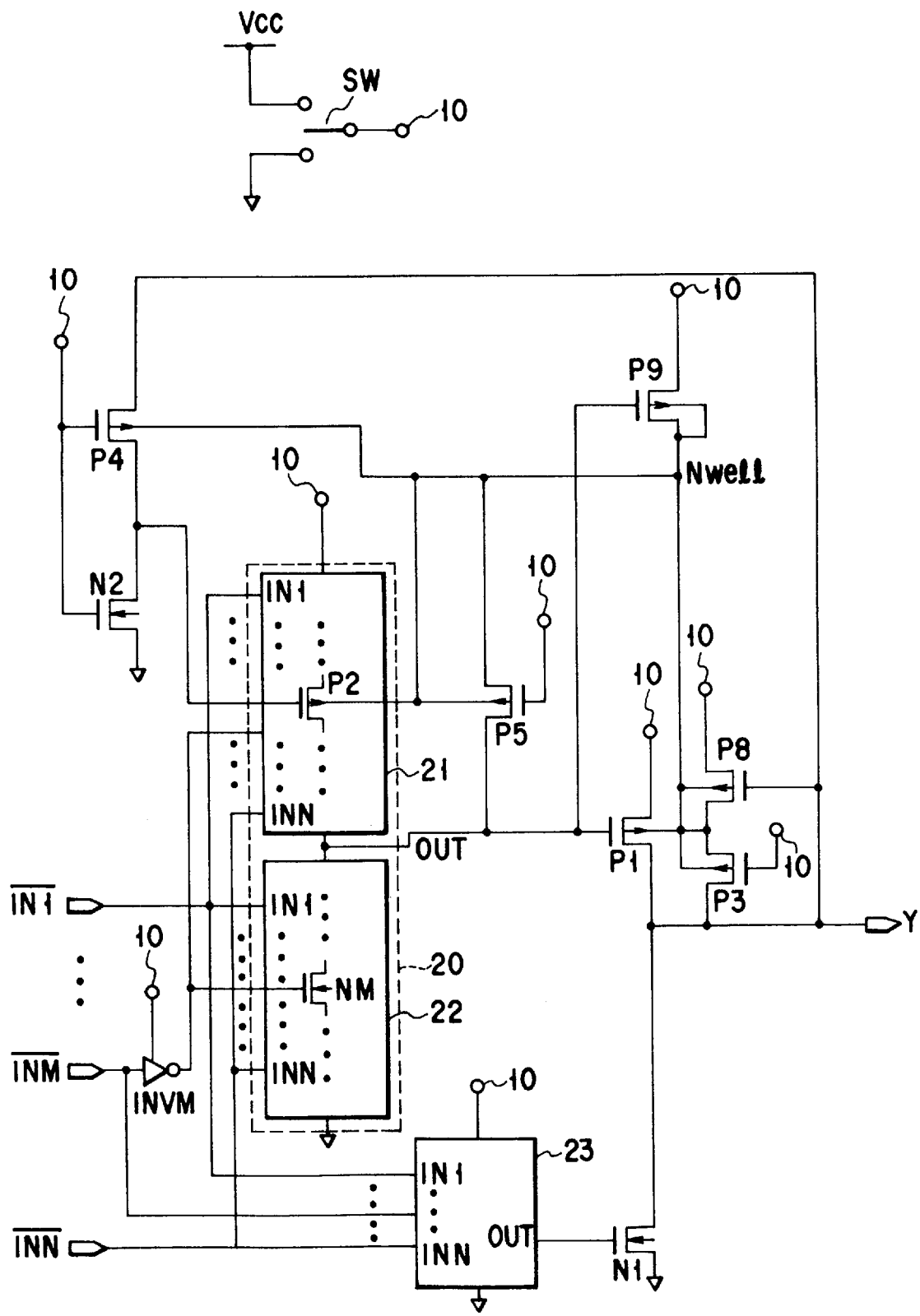
F I G. 16

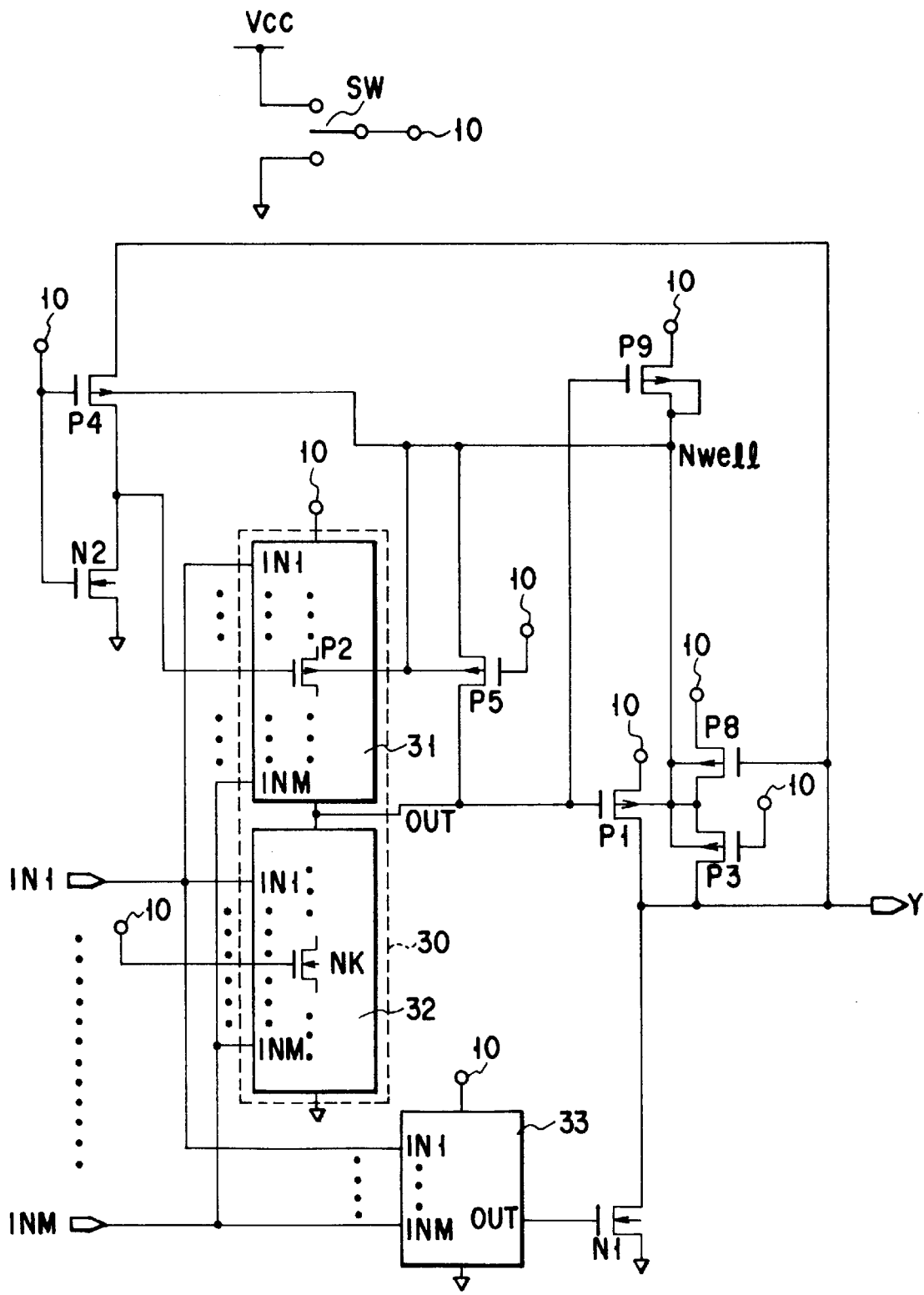
F I G. 23

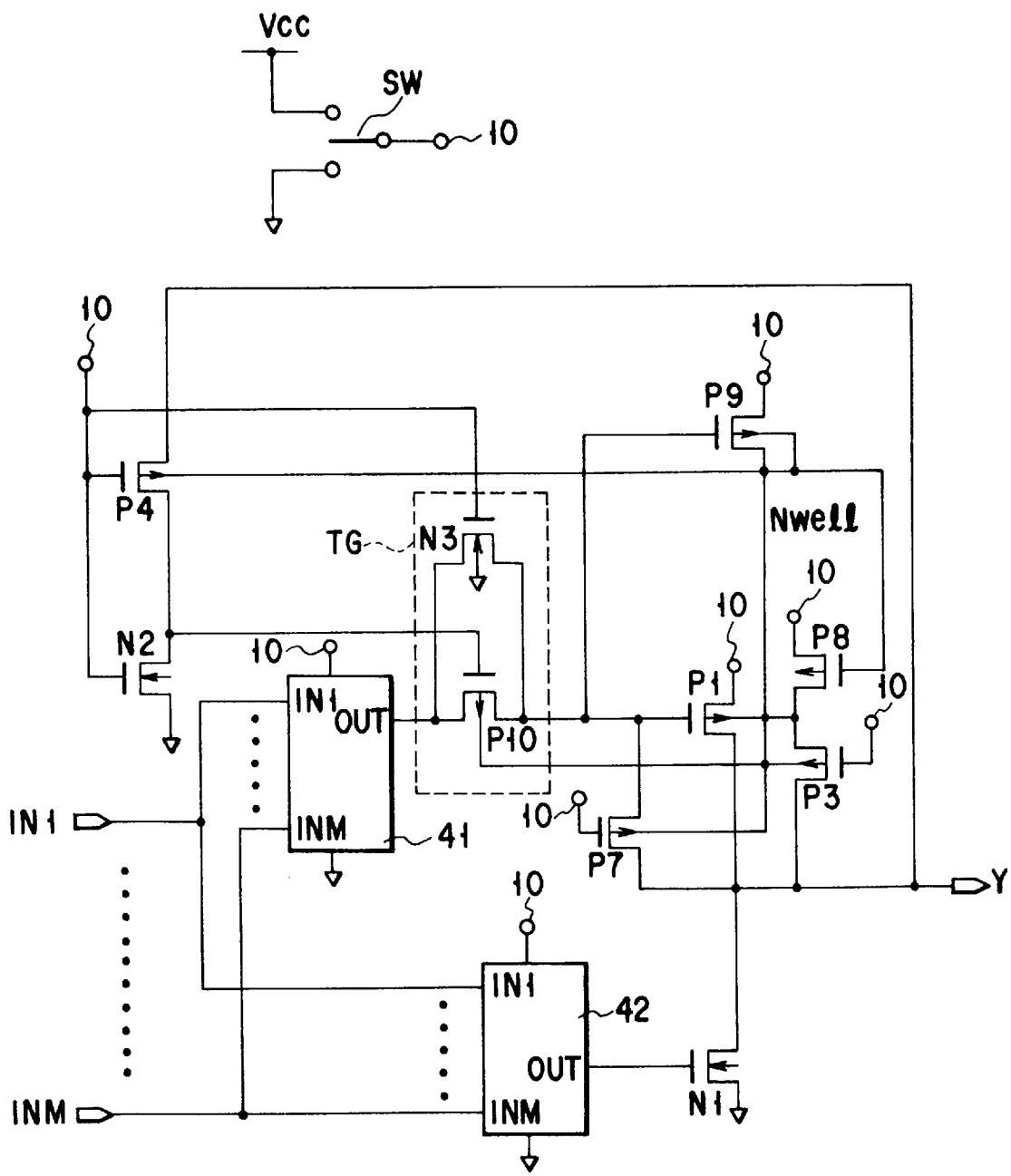
F I G. 30

5,880,603

MOS OUTPUT BUFFER WITH OVERVOLTAGE PROTECTION CIRCUITRY

BACKGROUND OF THE INVENTION

1. Field of the Invention

The present invention relates to an output circuit for use in the output section of a semiconductor integrated circuit, designed to output signals to a device provided outside the semiconductor integrated circuit.

2. Description of the Related Art

FIG. 1 shows conventional output circuit which is designed for use in a semiconductor integrated circuit and which is driven by two respective power supplies. A first output circuit 51 generates a signal from an input signal IN. A second output circuit 52 generates a signal OUT from the output signal of the first output circuit 51. To be more specific, the output signal of the circuit 51 is supplied through a signal line 53 to the input terminal of the circuit 52. Both output circuits 51 and 52 have their signal-outputting states determined by the signals input to them. For example, the state of the signal line 53 is determined by the signal IN input to the output circuit 51. The signal line 53 is terminated at a resistor 54 to prevent the output signal of the circuit 51 from undergoing propagation reflection.

Power-supply potential Vcc is applied to the second output circuit 52, whereas the power-supply terminal of the first output circuit 51 is connected to either the Vcc power supply or the ground, by operating a switch SW. In the instance of FIG. 1, the power-supply terminal of the circuit 51 is connected to the ground. In the first output circuit 51, a diode 55 is connected between the power-supply terminals and the output terminal.

Both output circuits 51 and 52 may be of CMOS structure. In this case, the first output circuit 51 has the specific structure of FIG. 2. As shown in FIG. 2, the circuit 51 comprises a P-channel MOS transistor 61, an N-channel MOS transistor 62 and a pn-junction diode 63—all provided in the output section. The P-type drain diffusion layer of the P-channel MOS transistor 61 and the N-type drain diffusion layer of the N-type MOS transistor 62 are connected to the signal line 53. The pn-junction diode 63 is a parasitic one connected between the drain of the P-channel MOS transistor 61 and the back gate (i.e., substrate) of the output circuit. The pn-junction diode 63 is identical to the diode 55 shown in FIG. 1.

Assume that the switch SW connects the power-supply terminal of the first output circuit 51 to the ground as shown in FIG. 1. Then, the built-in potential Vf of the diode 55 is lower than the power-supply potential Vcc applied to one end of the resistor 54. Namely, Vf<Vcc. The diode 55 is forwardly biased, whereby a current I flows from the Vcc power supply to the ground through the diode 55 and the switch SW.

To prevent the current I from flowing this way, the output section of the first output circuit 51 may comprise N-channel MOS transistors only, as illustrated in FIG. 3. The output section of the circuit shown in FIG. 3 comprises two N-channel MOS transistors 62 and 64. The gate of the N-channel MOS transistor 64 receives a control signal, which an inverter 65 has generated by inverting an input signal. The input signal is supplied as a control signal to the gate of the second N-channel MOS transistor 62.

Comprising N-channel MOS transistors only, the output section of the circuit (FIG. 3) can output the ground potential to the signal line 53. The power-supply potential Vcc the circuit outputs, however, decreases by the threshold voltage of the N-channel transistor 64.

In the conventional output circuit 51, as mentioned above, a current flows from the power supply (i.e., Vcc) to the ground via the diode 55 connected at one end to the signal line 53 and at the other end to the power supply, when a power-supply potential (i.e., the ground potential) is applied to the circuit 51, which is different from the potential applied to the other end of the resistor. If measures are taken to prevent such a current flow, the output circuit 51 may fail to generate a sufficiently high output potential.

A conventional tristate output circuit and its problems will be described. In an electronic apparatus such as a computer, signals are transferred through a common bus line. FIG. 4 shows a typical example of bus-line application. To the bus line 71 there are supplied signals from two tristate buffer circuits 72 and 73 which are output circuits. Both tristate buffers 72 and 73 are of CMOS structure. The first tristate buffer 72 generates a signal from an input signal IN1 and supplies the signal to the bus line 71 when the enable signal EN1 supplied to it is active. Similarly, the second tristate buffer 73 generates a signal from an input signal IN2 and supplies the signal to the bus line 71 when the enable signal EN2 supplied to it is active. The outputs of both buffers 72 and 73 remain in high-impedance state when the enable signals EN1 and EN2 are inactive.

A power-supply potential Vcc is applied to the second tristate buffer 73. Either the power-supply potential Vcc or the ground potential is applied to the first tristate buffer 72 through a switch SW. In the instance of FIG. 4, the switch SW connects the buffer 72 to the ground. The buffer 72 comprises a diode 74, which is connected between the input terminal and the power-supply terminal.

Either tristate buffer has the MOS structure shown in FIG. 5. As seen from FIG. 5, the output section of the buffer comprises a P-channel MOS transistor 81 and an N-channel MOS transistor 82. Supplied to the gate of the P-channel MOS transistor 81 is a control signal generated by a NAND circuit 84. The NAND circuit 84 receives the input signal IN and the output signal of an inverter 83. The inverter 83 inverts the enable signal EN. Supplied to the gate of the N-channel MOS transistor 82 is a control signal generated by a NOR circuit 85 which receives the enable signal EN and the input signal IN. The P-type drain diffusion layer of the P-channel MOS transistor 81 and the N-type drain diffusion layer of the N-channel MOS transistor 82 are connected to the output node 86. A parasitic pn-junction diode 87 is therefore formed between the output node 86 and the back gate of the P-channel MOS transistor 81. The pn-junction diode 87 is identical to the diode 74 shown in FIG. 4.

Assume that the switch SW connects the power-supply terminal of the first tristate buffer 72 to the ground as illustrated in FIG. 4, and that the second tristate buffer 73 outputs a Vcc-level signal. Then, the built-in potential Vf of the diode 74 is lower than the power-supply potential Vcc. Namely, Vf<Vcc. The diode 74 is forwardly biased, whereby a current I flows from the Vcc power supply to the ground through the diode 74 and the switch SW.

To prevent the current I from flowing this way, the output section of the tristate buffer may comprise N-channel MOS transistors only, as illustrated in FIG. 6. The output section of the tristate buffer shown in FIG. 6 comprises two N-channel MOS transistors 82 and 88. The gate of the N-channel MOS transistor 88 receives a control signal which a NOR circuit 89 has generated. The NOR circuit 89 receives an enable signal EN and an output signal of an inverter 83. The inverter 83 inverts an input signal IN. The gate of the N-channel MOS transistor 82 receives a control signal generated by a NOR circuit 85 which receives the enable signal EN and the input signal IN, as in the tristate buffer illustrated in FIG. 5.

Comprising N-channel MOS transistors only, the output section of the buffer (FIG. 6) can output the ground potential from the output node 86. The power-supply potential Vcc it outputs, however, decreases by the threshold voltage of the N-channel transistor 88.

In the conventional tristate buffer (i.e., an output circuit) connected to another tristate buffer by a bus line, as described above, a current flows from the other buffer to the ground via the parasitic diode 87, when the power-supply potential is the ground potential while the buffer remains off. If measures are taken to prevent such a current flow, the tristate buffer may fail to generate a sufficiently high output potential.

SUMMARY OF THE INVENTION

Accordingly it is the object of the invention to provide an output circuit which can generate a sufficiently high potential and which can prevent an unnecessary current from flowing from the power supply to the ground through a parasitic diode even if the output is terminated at a resistor or even if the output circuit is connected to another output circuit and at least one circuit has its power supply connected to the ground.

According to a first aspect of the invention, there is provided an output circuit which comprises: an output terminal; an MOS transistor having a source, a drain connected to the output terminal, a gate connected to receive a control signal, and a back gate isolated from the source in terms of potential; and a switch circuit connected between the back gate and gate of the MOS transistor and controlled to be off when first and second ends of a current path between the source and drain of the MOS transistor have a first potential relation and to be on when the first and second ends of the current path have a second potential relation.

According to a second aspect of this invention, there is provided an output circuit comprising: an output terminal; a power-supply node for receiving either a first power-supply potential or a second power-supply potential; a first MOS transistor having a source, a drain, a gate connected to receive a control signal, and a back gate isolated from the source in terms of potential; and a second MOS transistor of the same channel type as the first MOS transistor, having a source, a drain, a gate and a back gate, and a source-drain path connected between the back gate and gate of the first MOS transistor, and controlled to be off when the first power-supply potential is applied to the power-supply node and to be on when the second power-supply potential is applied to the power-supply node.

According to a third aspect of the invention, there is provided an output circuit comprising: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, a drain, a gate connected to the first power-supply node, and a source-drain path connected between the back gate and the gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; and a control-signal generating circuit for generating the control signal from a first signal. The first control-signal generating circuit comprises: a fifth MOS transistor of the first channel type, having a source, a drain, a gate connected to a node of the source-drain paths of the third and fourth MOS transistors, and a source-drain path connected between the first power-supply node and the gate of the first MOS transistor; a sixth MOS transistor of the first channel type, having a source, a drain, a gate for receiving a first signal, and a source-drain path connected in series to the source-drain path of the fifth MOS transistor; and a seventh MOS transistor of the second channel type, having a source, a drain, a gate for receiving the first signal, and a source-drain path connected between the gate of the first MOS transistor and the second power-supply node. The output circuit further comprises a second control-signal generating circuit for receiving power-supply voltages which are voltages at the first and second power-supply nodes, and generating the first signal to be supplied to the gates of the sixth and seventh MOS transistors.

According to a fourth aspect of the invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, a drain, a gate, a source-drain path connected between the back gate and gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; a first control-signal generating circuit for generating the control signal from a plurality of signals. The first control-signal generating circuit comprises: a fifth MOS transistor of the first channel type, having a source, a drain, a gate connected to a node of the source-drain paths of the third and fourth MOS transistors, and a source-drain path connected between the first power-supply node and the gate of the first MOS transistor; a plurality of sixth MOS transistors of the first channel type, each having a source, a drain, a gate for receiving one of the plurality of signals, and a source-drain path connected between the first power-supply node and the gate of the first MOS transistor and in series to the source-drain path of the fifth MOS transistor; and a plurality of seventh MOS transistors of the second channel type, each having a source, a drain, a gate for receiving one of the plurality of signals, and a source-drain path connected in series between the gate of the first MOS transistor and the second power-supply node. The output circuit further comprises a second control-signal generating circuit for receiving power-supply voltages which are voltages at the first and second power-supply nodes, and generating any one of the plurality of signals.

According to a fifth aspect of this invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, drain, a gate, a source-drain path connected between the output terminal and the gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; a first control-signal generating circuit for generating the control signal from a plurality of signals. The first control-signal generating circuit comprises: a fifth MOS transistor of the first channel type, having a source, a drain, a gate connected to a node of the source-drain paths of the third and fourth MOS transistors, and a source-drain path connected between the first power-supply node and the gate of the first MOS transistor; a plurality of sixth MOS transistors of the first channel type, each having a source, a drain, a gate for receiving one of the plurality of signals, and a source-drain path connected between the first power-supply node and the gate of the first MOS transistor and in series to the source-drain path of the fifth MOS transistor; and a plurality of seventh MOS transistors of the second channel type, each having a source, a drain, a gate for receiving one of the plurality of signals, and a source-drain path connected in series between the gate of the first MOS transistor and the second power-supply node. The output circuit further comprises a second control-signal generating circuit for receiving power-supply voltages which are voltages at the first and second power-supply nodes, and generating any one of the plurality of signals.

According to a sixth aspect of the invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, drain, a gate connected to the first power-supply node, and a source-drain path connected between the back gate and gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; and a first control-signal generating circuit for generating the control signal from an input signal. The first control-signal generating circuit comprises: a fifth MOS transistor of the first channel type, having a source, a drain, a gate connected to a node of the source-drain paths of the third and fourth MOS transistors, and a source-drain path connected at a first end to the first power-supply node; a sixth MOS transistor of the first channel type, having a source, a drain, a gate for receiving the input signal, and a source-drain path connected between a second end of the source-drain path of the fifth MOS transistor and the gate of the first MOS transistor; and a seventh MOS transistor of the second channel type, having a source, a drain, a gate for receiving the input signal, and a source-drain path connected between the gate of the first MOS transistor and the second power-supply node.

According to a seventh aspect of the present invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, drain, a gate connected to the first power-supply node, and a source-drain path connected between the output terminal and the gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; and a first control-signal generating circuit for generating the control signal from an input signal. The first control-signal generating circuit comprises: a fifth MOS transistor of the first channel type, having a source, a drain, a gate connected to a node of the source-drain paths of the third and fourth MOS transistors, and a source-drain path connected at a first end to the first power-supply node; a sixth MOS transistor of the first channel type, having a source, a drain, a gate for receiving the input signal, and a source-drain path connected between a second end of the source-drain path of the fifth MOS transistor and the gate of the first MOS transistor; and a seventh MOS transistor of the second channel type, having a source, a drain, a gate for receiving the input signal, and a source-drain path connected between the gate of the first MOS transistor and the second power-supply node.

According to an eighth aspect of the invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, a drain, a gate connected to the first power-supply node, and a source-drain path connected between the back gate and gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; and a first control-signal generating circuit for generating the control signal from a plurality of input signals and for supplying the control signal to the gate of the first MOS transistor. The first control-signal generating circuit comprises: a fifth MOS transistor of the first channel type, having a source, a drain, a gate connected to a node of the source-drain paths of the third and fourth MOS transistors, and a source-drain path connected at a first end to the first power-supply node; a plurality of sixth MOS transistors of the first channel type, each having a source, a drain, a gate for receiving one of the input signals, and a source-drain path connected in parallel between a second end of the source-drain path of the fifth MOS transistor and the gate of the first MOS transistor; and a plurality of seventh MOS transistors of the second channel type, each having a source, a drain, a gate for receiving one of the input signals, and a source-drain path connected between the gate of the first MOS transistor and the second power-supply node.

According to a ninth aspect of this invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, a drain, a gate connected to the first power-supply node, and a source-drain path connected between the back gate and gate of the first MOS transistor; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; a first control-signal generating circuit for receiving power-supply voltages which are voltages at said first power-supply node and said second power-supply node and for generating the control signal from a plurality of input signals and for supplying the control signal to the gate of the first MOS transistor; a fifth MOS transistor of the second channel type, having a source, a drain, a gate connected to the first power-supply node, and a source-drain path connected between an output node of the first control-signal generating circuit and the gate of the first MOS transistor; and a sixth MOS transistor of the first channel type, having a source, a drain, a gate connected to a node of the source-drain paths of the third and fourth MOS transistors, and a source-drain path connected between an output node of the first control-signal generating circuit and the gate of the first MOS transistor.

According to a tenth aspect of the invention, there is provided an output circuit which comprises: an output terminal; a first power-supply node for receiving either a first power-supply potential or a second power-supply potential; a second power-supply node for receiving the second power-supply potential; a first MOS transistor of a first channel type, having a source, a drain, a gate connected to receive a control signal, a back gate isolated from the source in terms of potential, and a source-drain path connected between the first power-supply node and the output terminal; a second MOS transistor of the first channel type, having a source, a drain, a gate connected to the first power-supply node, and a source-drain path connected between the gate of the first MOS transistor and the output terminal; a third MOS transistor of the first channel type, having a source, a drain, a gate connected to the first power-supply node, and a source-drain path connected at a first end to the output terminal; a fourth MOS transistor of a second channel type, having a source, a drain, a gate connected to the first power-supply node, and a source-drain path connected between the second power-supply node and a second end of the source-drain path of the third MOS transistor; a first control-signal generating circuit connected between the first and second power-supply nodes, for generating the control signal from an input signal and for supplying the control signal to the gate of the first MOS transistor; a fifth MOS transistor of the second channel type, having a source, a drain, a gate connected to the first power-supply node, and a source-drain path connected between an output node of the first control-signal generating circuit and the gate of the first MOS transistor; and a sixth MOS transistor of the first channel type, having a source, a drain, a gate connected to a node of the source-drain paths of the third and fourth MOS transistors, and a source-drain path connected between an output node of the first control-signal generating circuit and the gate of the first MOS transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a circuit diagram of an output circuit according to a first embodiment of the invention;

FIG. 11 is a circuit diagram of an output circuit according to a fourth embodiment of the invention;

FIG. 13 is a circuit diagram of an output circuit according to a sixth embodiment of the invention;

FIG. 14 is a circuit diagram of an output circuit according to a seventh embodiment of the invention;

FIG. 16 is a circuit diagram of an output circuit according to a ninth embodiment of the invention;

FIG. 23 is a circuit diagram of an output circuit according to a sixteenth embodiment of the invention;

FIG. 30 is a circuit diagram of an output circuit according to a twenty-third embodiment of the present invention.

DETAILED DESCRIPTION OF THE PREFERRED EMBODIMENTS

Various embodiments of the present invention will be described, with reference to the accompanying drawings.

Figure 5:
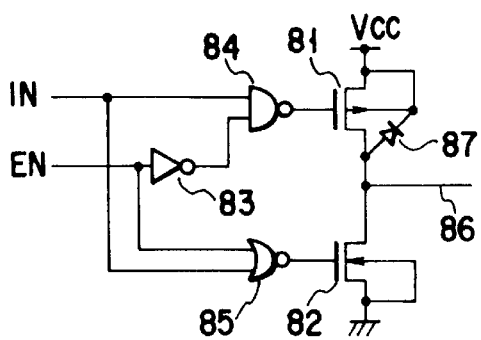
FIG. 5 is a circuit diagram of one of the output circuits shown in FIG. 4.
Figure 6:
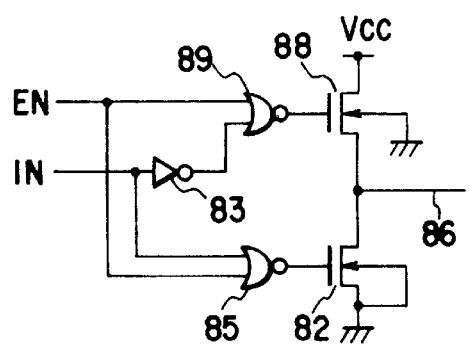
FIG. 6 is a circuit diagram illustrating a modification of the output circuit shown in FIG. 5.

FIG. 7 shows an output circuit according to the first embodiment. As in the conventional circuit shown in FIG. 5, the output section of the first embodiment comprises a P-channel MOS (PMOS) transistor P1 and an N-channel MOS (NMOS) transistor N1. The gates of both MOS transistors are controlled by signals generated by means provided in the output circuit. The signal-generating means comprises a circuit equivalent to a NAND circuit, a NOR circuit NOR1, and an inverter INV1.

The PMOS transistor P1 and the NMOS transistor N1 have their drains connected to an output terminal Y. The source of the PMOS transistor P1 is connected to a power-supply node 10, to which the power-supply potential Vcc or the ground potential is applied through a switch SW. The source of the NMOS transistor N1 is connected to a ground-potential node.

In most semiconductor devices, the back gate of a PMOS transistor is set at the same potential as the source. In the first embodiment, however, the source and back gate of the PMOS transistor P1 are isolated in terms of potential. Any other PMOS transistor (later described) used in the first embodiment also has its source and back gate isolated in term of potential. All PMOS transistors incorporated in the first embodiment, including the transistor P1, have their back gates connected to one another. Any NMOS transistor used in the first embodiment, including the transistor N1, has its back gate and source set at the same potential.

As shown in FIG. 7, the output circuit further comprises PMOS transistors TP1 and TP2 and NMOS transistor TN1 and TN2. These transistors TP1, TP2, TN1 and TN2 constitute a NAND circuit which generates a signal for driving the gate of the PMOS transistor P1. The PMOS transistors TP1 and TP2 have their sources connected together and their drain connected together, forming a drain node. The drain node is connected to the gate of the PMOS transistor P1. The drain-source paths of the NMOS transistors TN1 and TN2 are connected in series to each other and also between the gate of the PMOS transistor P1 and the ground-potential node. The gate of the PMOS transistor TP1 and that of the NMOS transistor TN1 are connected to each other, forming a gate node. The gate node is connected to receive an enable signal /EN via the inverter INV1. The gate of the PMOS transistor TP2 and that of the NMOS transistor TN2 are connected to each other, forming a gate node. This gate node is connected to receive an input signal /IN. The NOR circuit NOR1 is connected to receive the enable signal /EN and the input signal /IN and generates a signal for driving the gate of the NMOS transistor N1.

The PMOS transistors TP1 and TP2 have their sources connected together, forming a source node. To the source node there is connected the drain of a PMOS transistor P2. The source-drain path of a PMOS transistor P3 is connected between the back gate of the PMOS transistor P1 and the output terminal Y. The gate of the PMOS transistor P3 is connected to the power-supply node 10.

The gate of a PMOS transistor P4 and the gate of an NMOS transistor N2 are connected to the power-supply node 10. The source of the PMOS transistor P4 is connected to the output terminal Y. The drains of the PMOS transistor P4 and NMOS transistor N2 are connected to each other. The source of the NMOS transistor N2 is connected to the ground-potential node.

The source-drain path of a PMOS transistor P5 is connected between the back gate of the PMOS transistor P1 and the drain of the PMOS transistor P2. The source-drain path of a PMOS transistor P6 is connected between the power-supply node 10 and the back gate of the PMOS transistor P1. The signal at the drain node of the PMOS transistor P4 and NMOS transistor N2 is supplied to the gates of the PMOS transistors P2 and P6.

Figure 8:
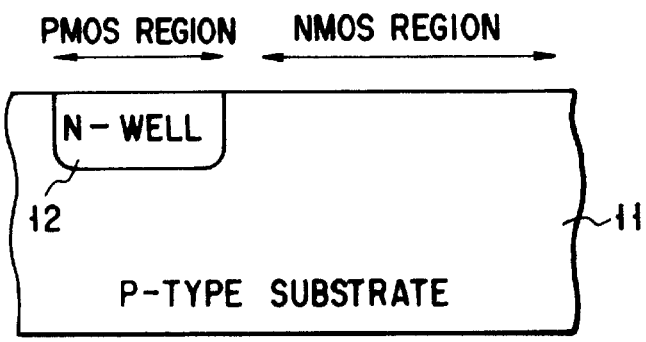
FIG. 8 is a sectional view of the substrate on which the output circuit shown in FIG. 7 is provided.

Generally, NMOS transistors are formed on a P-type substrate, and PMOS transistors on an N-type substrate. In the first embodiment (FIG. 7), NMOS and PMOS transistors are formed on a P-type substrate 11 as shown in FIG. 8, forming an integrated circuit. The PMOS transistors are provided on an N-well 12 formed in the surface of the P-type substrate 11, while each NMOS transistor is provided on the P-type substrate 11. When the switch SW is operated, setting the power-supply node 10 to the ground potential, a potential higher than the ground potential may be applied to the output terminal Y. In view of this, an N-type substrate cannot be used. If the substrate 11 is an N-type one, a parasitic pn-junction diode will be formed between the N-type substrate and a P-type diffusion layer (i.e., the drain of a PMOS transistor) formed in the N-type substrate. The pn-junction diode will be forwardly biased and an unnecessary current would flow, when a potential higher than the ground potential is applied to the output terminal Y while the power-supply node 10 remains set at the ground potential.

Therefore, in the first embodiment (FIG. 7), the back gates of the PMOS transistors P1 to P6, TP1 and TP2 are made of the N-well 12 shown in FIG. 8. (To indicate this, marks "Nwell" are used in FIG. 7.) All the PMOS transistors need not be provided on the same N-well. They may be formed on a plurality of N-wells which are electrically connected to one another. The back gates of the PMOS transistors TP1 and TP2 may be connected to the drain of the PMOS transistor P2.

The operation of the output circuit (FIG. 7), i.e., the first embodiment of the invention, will be explained, on the assumption that the Vcc level and the ground level are high and low, respectively. In the following explanation, each PMOS transistor and its threshold voltage will be referred to as "Px" (x=1, 2, . . . ) and "Vtp(Px)," and the threshold voltages of the PMOS transistors will be generally referred to as "Vtp."

Assume that the power-supply potential Vcc is applied to the power-supply node 10. In this case, the PMOS transistors P3, P5 and P4 are off because the gate node is set at Vcc. On the other hand, the NMOS transistor N2 is on because its gate node is set also at Vcc. The gate potentials of the PMOS transistors P2 and P6 are pulled down to the ground potential, whereby the PMOS transistors P2 and P6 are turned on. Once the PMOS transistor P6 is turned on, the potential of the back gates Nwell of all PMOS transistors Px is pulled up. When the PMOS transistor P2 is turned on, the source node of the PMOS transistors TP1 and TP2 is pulled up to Vcc. As a result, the circuit comprised of the PMOS transistors TP1 and TP2 and NMOS transistors TN1 and TN2 can function as a NAND circuit. Thus, the first embodiment operates in the same way as a tristate buffer of ordinary type.

Let us now assume that the ground potential is applied to the power-supply node 10. Were the output circuit connected to a bus line as the conventional circuit shown in FIG. 4, the output terminal Y would be set at a potential higher than the ground potential while another output circuit (not shown) is outputting a potential Vy (e.g., a Vcc-level one) higher than the ground potential. Then, a large current would flow from the power-supply potential node of the other circuit through the bus line and the output terminal Y. This does not occur at all. The power-supply node 10 is set at the ground potential, and so are the gates of the PMOS transistors P3, P5, P4 and the gate of the NMOS transistor N2. Hence, the PMOS transistors P3, P5 and P4 are on, and the NMOS transistor N2 is off.

If Vy>|Vtp(P4)|, the PMOS transistor P4 is on, and the NMOS transistor N2 is off. The gate potential of the PMOS transistors P2 and P6 is equal to Vy, i.e., the potential at the output terminal Y. If Vy>|Vtp(P3)|, the PMOS transistor P3 is on, whereby the back gates Nwell of all PMOS transistors are set at Vy, i.e., the potential of output terminal Y. In this case, a potential similar to Vy is applied to the back gate of the PMOS transistor P1 through the pn-junction diode provided between the output terminal Y and the back gate of the PMOS transistor P1. If Vy>|Vtp(P5)|, the PMOS transistor P5 is on, whereby the back-gate potential of this transistor is applied to the source node of the PMOS transistors TP1 and TP2. The gate-source potential difference of the PMOS transistors P2 and P6 are therefore zero, and these transistors are off.

The output potential of the inverter INV1 is set at the ground potential, too, since the power-supply potential of the inverter INV1 is the ground potential. If Vy>|Vtp(TP1)|, the PMOS transistor TP1 is on, whereas the NMOS transistor TN1 is off. The potential at the node of the PMOS transistors TP2 and P5 is applied to the gate of the PMOS transistor P1. Since the gate of the PMOS transistor P1 is set at a potential equal to Vy (i.e., the potential of the output terminal Y), the gate-source potential difference of P1 is zero. Therefore, the PMOS transistor P1 is off. The power-supply potential of the NOR circuit NOR1 is set at the ground potential, and so is the output potential of the NOR circuit NOR1. The NMOS transistor N1 is off. No current flows from the output terminal Y to the ground-potential node.

The above explanation is based on the assumption that the PMOS transistors have different threshold voltages. In fact, however, the PMOS transistors are virtually the same threshold voltage since they are provided on the same substrate. The PMOS transistors P3, P5 and TP1 can be considered to be turned on almost simultaneously. Until the potential Vy rises above |Vtp|, the current flowing in the PMOS transistor P1 is negligibly small since the gate-source potential difference of the transistor P1 is as small as almost |Vtp|.

When the power-supply potential Vcc is applied to the output circuit, the output of the circuit can fully change from the ground potential to the power-supply potential. Even when the power-supply node 10 is set at the ground potential, no current flows from the output terminal Y to the ground potential terminal.

Figure 9:
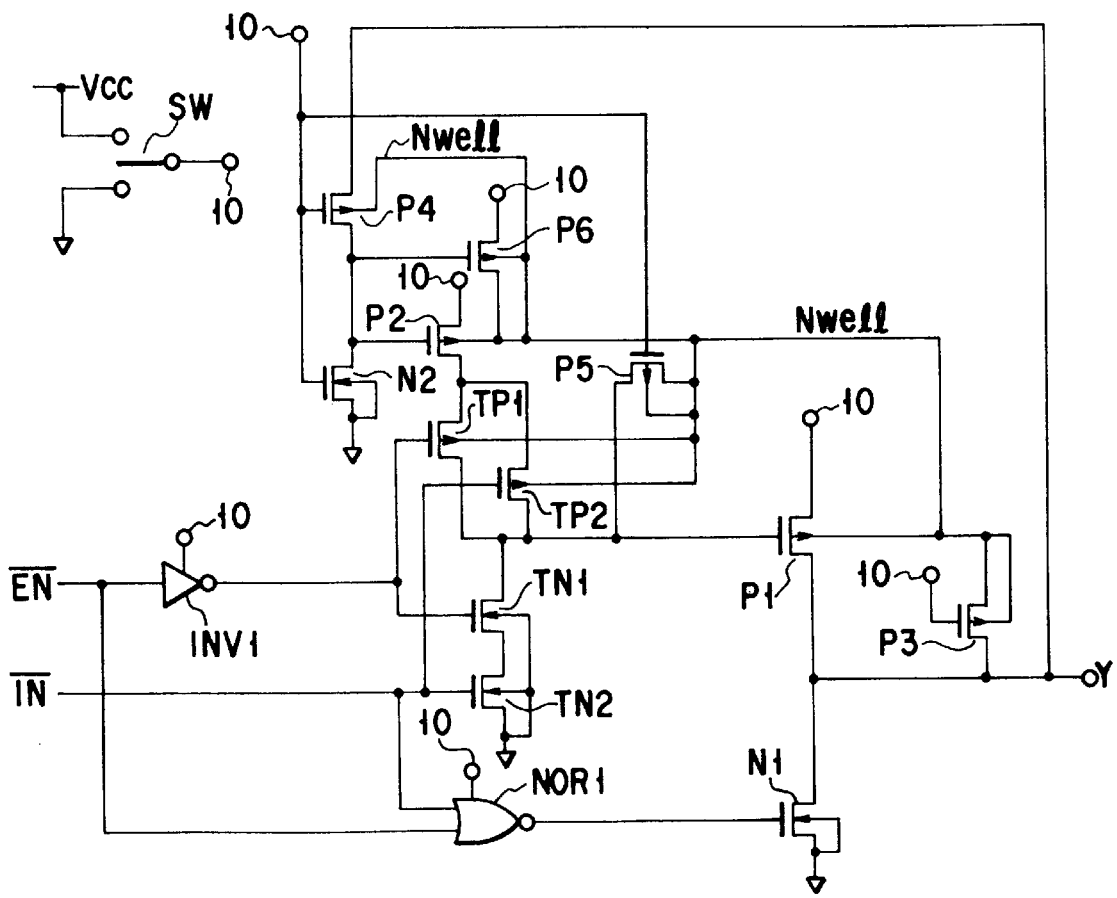
FIG. 9 is a circuit diagram of an output circuit according to a second embodiment of the invention.

In the first embodiment of FIG. 7, the PMOS transistor P5 which is switched in accordance with the back-gate potential of the PMOS transistor P1, applied to its gate, is connected at one end to the drain of the PMOS transistor P2. Instead, the one end of the PMOS transistor P5 may be connected directly to the gate of the PMOS transistor P1 as is shown in FIG. 9, which illustrates an output circuit according to the second embodiment of the invention.

As indicated above, in the first embodiment (FIG. 7) the potential of the output terminal Y is applied to the gate of the PMOS transistor P1 via the three PMOS transistors P3, P5 and TP1 when the potential is higher than the ground potential while the power-supply node 10 remains at the ground potential. In the second embodiment (FIG. 9), the potential of the output terminal Y is applied to the gate of the PMOS transistor P1 through two PMOS transistors P3 and P5. Thus, it is applied faster than in the first embodiment shown in FIG. 7, and the PMOS transistor P1 is turned off more quickly. This decreases the transient current flowing from the output terminal Y to the ground potential terminal. The load capacitance parasitic to the gate of the PMOS transistor P1, however, increases and probably reduces the speed at which the signal at the gate node of the transistor P1 changes in magnitude.

Furthermore, the current consumed increases by the current charged and discharged as the parasitic capacitance of the gate of the PMOS transistor P1 increases. This is inevitable because the signal at the gate node of the transistor P1 swings fully during normal operation of the circuit, whereas the signal at the drain of the PMOS transistor P2 swings but a little.

Figure 10:
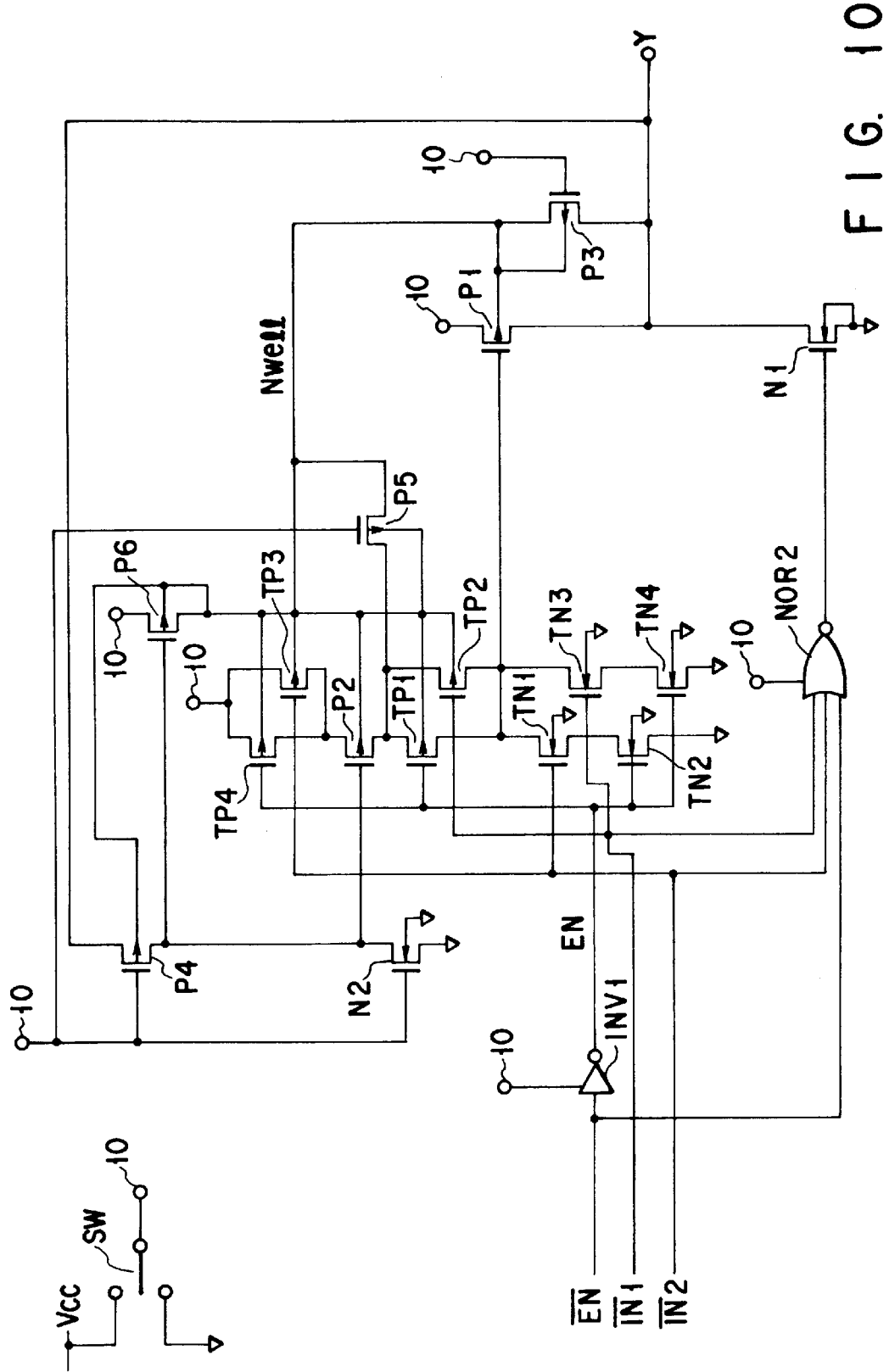
FIG. 10 is a circuit diagram of an output circuit according to a third embodiment of the invention.

FIG. 10 shows an output circuit according to the third embodiment of the present invention. This embodiment is designed to receive two input signals /IN1 and /IN2. It differs from the first and second embodiments (FIGS. 7 and 9) in which an enable signal /EN and an input signal /IN are NANDed or NORed, to turn on and off the PMOS transistor P1 and NMOS transistor N1 of the output section.

In the third embodiment, the source of the PMOS transistor P2 is connected not directly to the power-supply node 10. Rather, between the source of the PMOS transistor P2 and the power-supply node 10, the source-drain paths of two PMOS transistors TP3 and TP4 are connected in parallel. The gate of the PMOS transistor TP4 is connected to receive an enable signal EN, which is the output of an inverter INV1, while the gate of the PMOS transistor TP3 receives the second input signal /IN2. The gate of the PMOS transistor TP1 is connected to receive the enable signal EN, and the gate of the PMOS transistor TP2 to receive the first input signal /IN1, not an input signal /IN as in the first and second embodiments.

Two NMOS transistors TN1 and TN2 constitute a series circuit as in the first and second embodiments. Two more NMOS transistors TN3 and TN4 also constitute a series circuit. The two series circuits, thus formed, are connected in parallel. The gates of the NMOS transistors TN1, TN2, TN3 and TN4 are connected to receive the signals /IN2, EN, /IN1 and EN, respectively. The third embodiment has a three-input NOR circuit NOR2, which is connected to receive signals /EN, /IN1 and /IN2. The NOR circuit NOR2 is a counterpart to the two-input NOR circuit (NOR1) incorporated in the first and second embodiments.

The third embodiment differs from the first and second embodiments in that it receives two input signals /IN1 and /IN2. Nevertheless, it operates basically in the same way as the first and second embodiments. It is characterized in two respects. First, the source-drain path of the PMOS transistor P2 is connected between the source node of the PMOS transistors TP1 and TP2 and the drain node of the PMOS transistors TP3 and TP4, thus functioning as an intermediate node. Second, while the ground potential is applied to the power-supply node 10, the potential at one end of the PMOS transistor P5 is applied to the gate of the PMOS transistor P1 via the PMOS transistor TP1 whose gate is set at the ground potential. It should be noted that the gate of PMOS transistor TP1 is at the ground potential at this time, since the power-supply node 10 of the inverter IN1 receiving an enable signal /EN is set at the ground potential.

In the third embodiment (FIG. 10), the order in which the NMOS transistors TN1 and TN2 may be altered, and so may be the order in which the NMOS transistors TN3 and TN4 are arranged. Further, the node of the NMOS transistors TN1 and TN2 and the node of the NMOS transistors TN3 and TN4 may be connected to each other.

FIG. 11 shows an output circuit according to the fourth embodiment of the invention. The fourth embodiment is characterized in two respects. First, an enable signal EN is supplied to MOS transistors TP1 and TN1, instead of an enable signal /EN supplied to an inverter INV1 and then to the transistors TP1 and TN1 as in the first, second and third embodiments. Second, an input signal IN is supplied via an inverter INV11 to MOS transistors TP2 and TN2. The inverter INV11 has its power terminal connected to the power-supply node 10.

As long as the power-supply potential Vcc is applied to the node 10, the fourth embodiment operates in the same way as the first embodiment shown in FIG. 7. While the power-supply node 10 is set at the ground potential, the potential at the PMOS transistor P5 is applied to the gate of the PMOS transistor P1 through the PMOS transistor TP2. This is because the power-supply potential of the inverter INV11 is set at the ground potential, and so is the output of the inverter INV11. The PMOS transistor TP2 is therefore on, while the NMOS transistor TN2 is off. There is no current path extending from the gate node of the PMOS transistor P1 to the ground-potential node. Any other section of the fourth embodiment operates in the same way as their counterparts of the first embodiment (FIG. 7).

The output circuit according to the fourth embodiment can operate in a desired manner, too, though an inverter whose power supply node is the node 10 is provided in the path of the input signal, not in the path of the enable signal as in the first, second and third embodiments.

Figure 12:
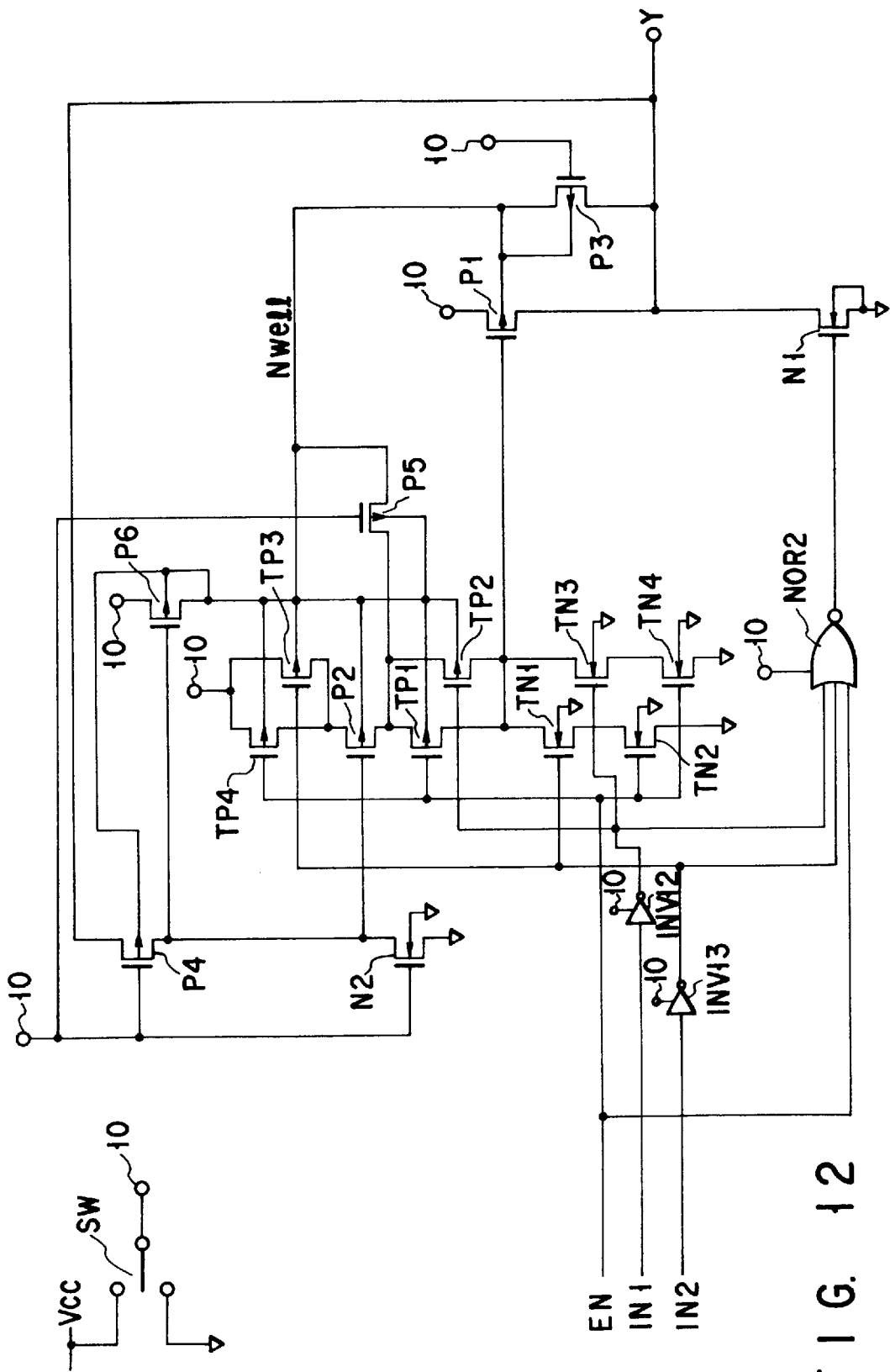
FIG. 12 is a circuit diagram of an output circuit according to a fifth embodiment of the invention.

FIG. 12 illustrates an output circuit according to the fifth embodiment of this invention. The fifth embodiment is characterized in three respects. First, an enable signal EN is supplied directly to MOS transistors TP1, TP4, TN2 and TN4, not through an inverter. Second, an input signal IN1 is supplied via an inverter INV12 to MOS transistors TP2 and TN3 and also to the NOR circuit NOR2. Third, an input signal IN2 is supplied via an inverter INV13 to MOS transistors TP3 and TN1. The power-supply terminals of the inverters INV12 and INV13 are connected to the power-supply node 10.

The fifth embodiment operates in the same way as the third embodiment (FIG. 10) when the power-supply potential Vcc is applied to the power-supply node 10. When the node 10 is set at the ground potential, the potential applied through the PMOS transistor P5 is transferred to the gate node of the PMOS transistor P1 through the PMOS transistor TP2 since the power-supply potential of the inverter INV12 is set at the ground potential and has its output set thereat. At this time, the PMOS transistor TP2 is on. Since the power-supply potential of the inverter INV13 is also the ground potential and has its output set thereat, the NMOS transistors TN1 and TN3 are turned off, whereby the current path extending from the gate node of the PMOS transistor P1 to the ground-potential node ceases to exist. All other components of the fifth embodiment (FIG. 12) operate in the same way as their counterparts of the fourth embodiment (FIG. 11).

The output circuit according to the fifth embodiment can operate in a desired manner, too, though inverters whose power supply nodes are the node 10 are provided in the path of the input signal as in the fourth embodiment (FIG. 11), not in the path of the enable signal as in the first, second and third embodiments.

The embodiments shown in FIGS. 7, 10, 11 and 12 have two technical features. The first feature resides in that the PMOS transistors provided between the gate and back gate of the PMOS transistor P1 have their power-supply potentials set at the ground potential, so that these PMOS transistors may be turned on to transfer the potential of the PMOS transistor P5 to the gate of the PMOS transistor P1 when the power-supply potential becomes equal to the ground potential. This is achieved by changing the power-supply voltage of the circuit applying a voltage to the gates of these PMOS transistors to the ground potential. The first feature is not found in the second embodiment shown in FIG. 9, since the potential applied to the PMOS transistor P5 is transferred directly to the gate of the PMOS transistor P1 when the power-supply potential becomes equal to the ground potential. The second feature resides in that the NMOS transistors provided in the current path extending from the gate of the PMOS transistor P1 to the ground-potential node have their gate potentials set at the ground potential when the power-supply potential becomes equal to the ground potential, so that these NMOS transistors may be turned off so that the current path extending from the gate node of the PMOS transistor P1 to the ground-potential node ceases to exist. This feature is achieved by changing the power-supply voltage of the circuit applying a voltage to the gates of these NMOS transistors to the ground potential. The second feature is found also in the second embodiment shown in FIG. 9.

FIG. 13 shows a bistate buffer which is the sixth embodiment of the invention and which has the first and second features described above. N input signals /IN1, . . . /INM, . . . /NN shown in FIG. 13, all shown in FIG. 13, correspond to signals /IN, /IN1, /IN2 and /EN circuit supplied to the first to fifth embodiments (FIGS. 7, 9, 10, 11 and 12). In the sixth embodiment, the input signal /INM has the function of the enable signal /EN. This signal /INM is inverted by an inverter INVM.

The sixth embodiment comprises a CMOS circuit 20. The CMOS circuit 20 is a multi-input NAND circuit similar to the above-mentioned NAND circuit which consists of the PMOS transistors TP1 to TP4 and P2 and NMOS transistors TN1 to TN4. The CMOS circuit 20 comprises the PMOS circuit 21 and an NMOS circuit 22. The PMOS circuit 21 includes PMOS transistors only, and the NMOS circuit 22 includes NMOS transistors only. Those of the NMOS transistors of the NMOS circuit 22, which receive at their gates the output of the inverter INVM, are identified by "NM" in FIG. 13.

The sixth embodiment further comprises a CMOS circuit 23 which corresponds to the NOR circuit NOR2 incorporated in the third embodiment (FIG. 10). The CMOS circuit 23 is connected to receive N input signals /IN1, . . . /INM, . . . /INN and generates the signal for controlling the gate of an NMOS transistor N1 provided in the output section.

In the sixth embodiment, too, the source-drain path of the PMOS transistor P5 is connected at one end to the gate of the PMOS transistor P1 as in the second embodiment (FIG. 9) as indicated in the solid line in FIG. 13. Alternatively, it may be connected at one end to an intermediate node of the PMOS circuit 21, e.g., the drain of the PMOS transistor P2 as in the third embodiment (FIG. 10) as indicated in the broken line in FIG. 13. If this is the case, some measures must be taken so that the buffer may have the first feature described above.

FIG. 14 shows a bistate buffer which is the seventh embodiment of the invention and which has the first and second features described above. N input signals /IN1, . . . /INM, . . . INN shown in FIG. 14, all shown in FIG. 13, correspond to signals /IN, /IN1, /IN2 and /EN circuit shown in FIG. 13 supplied to the first to fifth embodiments (FIGS. 7, 9, 10, 11 and 12).

The seventh embodiment differs from the sixth embodiment (FIG. 13) in three respects. First, the PMOS transistor P7 is used in place of the PMOS transistor P5. Second, the source-drain path of the PMOS transistor P7 is connected between the output terminal Y and the gate of the PMOS transistor P1 included in the output section. Third, the gate of this transistor P7 is connected to the power-supply node 10.

When a potential higher than the ground potential is applied to the output terminal Y while the node 10 remains connected by the switch SW to the ground-potential node, the potential at the terminal Y is applied to the gate of the PMOS transistor P1 via PMOS transistor P7 only. (In the fifth embodiment, the potential is supplied to the gate of the PMOS transistor P1, first through the PMOS transistor P5 and then the PMOS transistor TP1.) Hence, the potential is applied faster than in the fifth embodiment shown in FIG. 12, and the PMOS transistor P1 is turned off more quickly. This decreases the transient current flowing from the output terminal Y to the ground potential terminal. The load capacitance parasitic to the gate of the PMOS transistor P1, however, increases and probably reduces the speed at which the signal at the gate node of the transistor P1 changes in magnitude. Furthermore, the current consumed increases by the current charged and discharged as the parasitic capacitance of the gate of the PMOS transistor P1 increases. This is inevitable because the signal at the gate node of the transistor P1 swings fully during normal operation of the circuit, whereas the signal at the drain of the PMOS transistor P2 swings but a little.

In the seventh embodiment, the source-drain path of the PMOS transistor P7 is connected at one end to the gate of the PMOS transistor P1 as indicated in the solid line in FIG. 14. Alternatively, it may be connected at one end to an intermediate node of the PMOS circuit 21, e.g., the drain of the PMOS transistor P2 as indicated in the broken line in FIG. 14. In this case, some measures must be taken so that the buffer may have the first feature described above.

Figure 15:
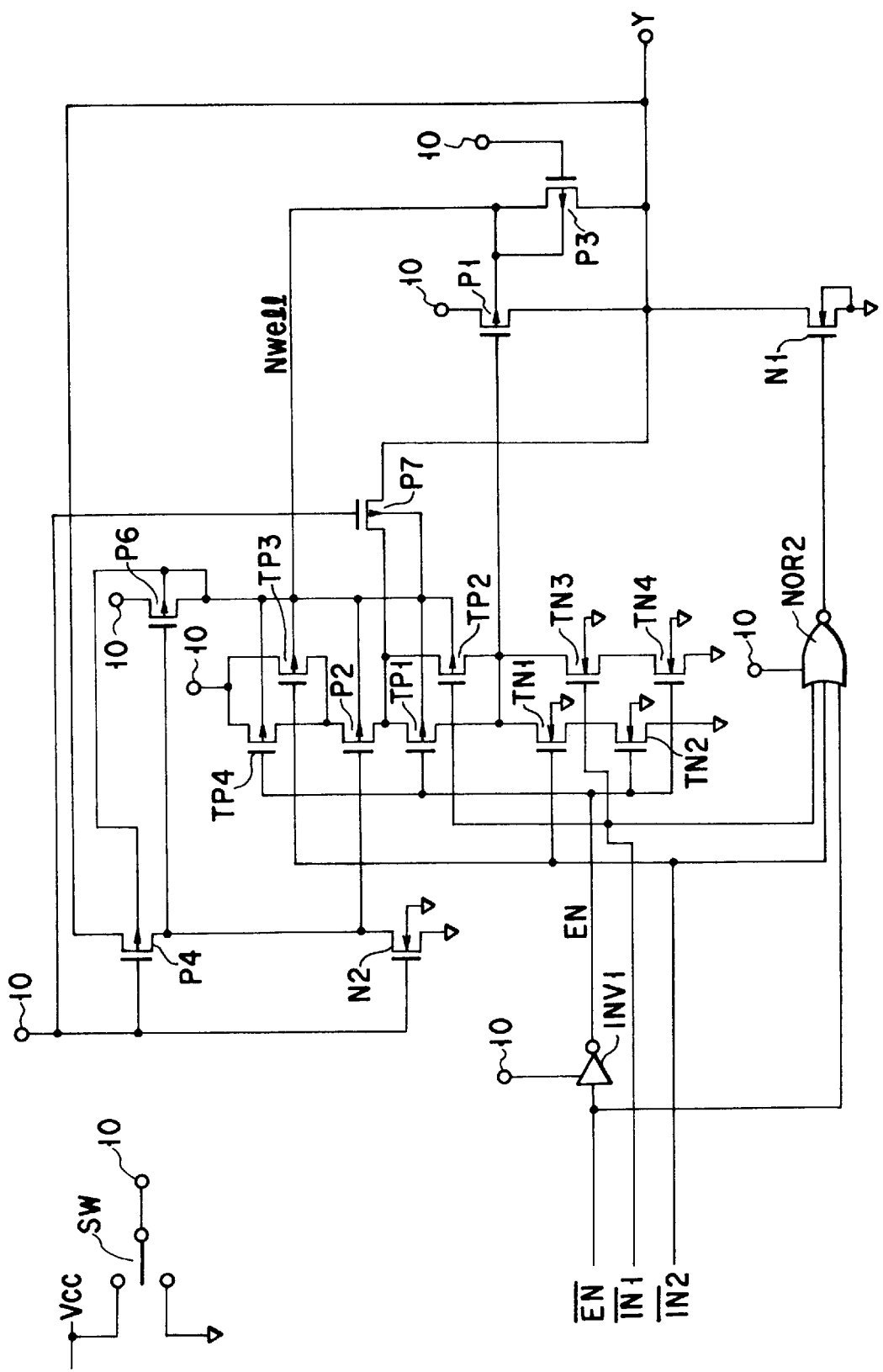
FIG. 15 is a circuit diagram of an output circuit according to an eighth embodiment of the invention.

FIG. 15 illustrates a multi-input output circuit according to the eighth embodiment of the present invention. The eighth embodiment is characterized in that the source-drain path of the PMOS transistor P7 is connected at one end to the drain of the PMOS transistor P2, which is an intermediate node in the PMOS circuit 21.

FIG. 16 shows a bistate buffer which is the ninth embodiment of this invention. This buffer is connected to receive N input signals /IN1 to /INN. The ninth embodiment differs from the sixth embodiment (FIG. 13) in that two PMOS transistors P8 and P9 are used, replacing the PMOS transistor P6. The source-drain path of the PMOS transistor P8 is connected between the back gate (Nwell) of the PMOS transistor P1 and the power-supply node 10. Its gate is connected to the output terminal Y. The source-drain path of the transistor P9 is connected between the power-supply node 10 and the Nwell, and has its gate connected to the gate of the transistor P1.

The PMOS transistors P8 and P9 cooperate to pull up the potential of the Nwell when the power-supply potential Vcc is supplied to the power-supply node 10, whereas in the sixth embodiment (FIG. 13) the PMOS transistor P6 pulls up the Nwell to the power-supply potential Vcc as long as the power-supply potential Vcc is applied to the power-supply node 10. While the gate node of the PMOS transistor P1 is set at the ground potential, the PMOS transistor P1 is on, and the PMOS transistor P9 pulls up the potential of the Nwell. On the other hand, while the gate node of the transistor P1 is set at the power-supply potential Vcc, the PMOS transistor P1 is off and the NMOS transistor N1 is on. As a result, the output terminal Y is set at the ground potential, whereby the PMOS transistor P8 is turned on and pulls up the potential of the Nwell.

All transistors other than the PMOS transistors P8 and P9 operate in the same way as their counterparts of the sixth embodiment shown in FIG. 13. It should be noted that the PMOS transistors P8 and P9 are turned off when the power-supply node 10 is connected to the ground-potential node and a potential higher than the ground potential is applied to the output terminal Y, because their gate potential increases above their source potential.

Figure 17:
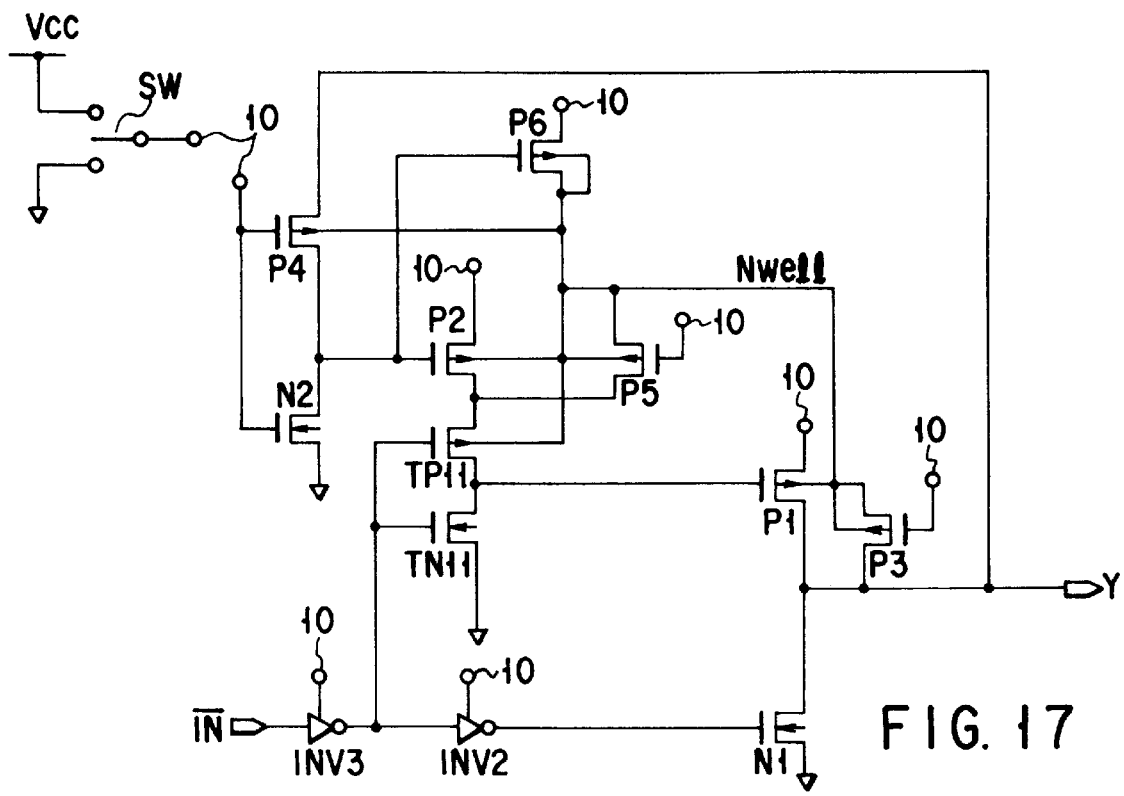
FIG. 17 is a circuit diagram of an output circuit according to a tenth embodiment of the invention.

FIG. 17 shows a bistate buffer which is the tenth embodiment of the present invention. This embodiment differs from the output circuit shown in FIG. 7 (i.e., the first embodiment) in three respects. First, an inverter INV2 is used in place of the NOR circuit NOR 1. Second, an inverter comprising the PMOS transistor TP11 and an NMOS transistor TN11 replaces the NAND circuit comprising the MOS transistors TP1, TP1, TN1 and TN2. Third, an additional inverter INV3 is provided to receive an input signal /IN, for the reason which will be described later. As in the circuit shown in FIG. 17, the PMOS transistor P5 has its source-drain path connected between the back gate N Well of the PMOS transistor P1 and the drain of the PMOS transistor P2.

How the tenth embodiment operates while the power-supply node 10 is set at the ground potential will be explained. The output node of the inverter INV3 remains at the ground potential. Thus, the NMOS transistor TN11 is off. Since the power-supply potential of the inverter INV2 is also set at the ground potential, its output potential is equal to the ground potential. An NMOS transistor N1 is therefore off. Hence, no current flows from the output terminal Y to the power-supply node 10. when a potential Vy or higher than the ground potential is applied to the output terminal Y, it is transferred to the drain of the PMOS transistor P2, as in the first embodiment (FIG. 7). At this time the gate of the PMOS transistor TP11 is set at the ground potential and is therefore on. Through the PMOS transistor TP11 the potential Vy is transferred to the gate of the PMOS transistor P1. No current path is formed which extends from the output terminal Y to the power-supply node 10 set at the ground potential.

Figure 18:
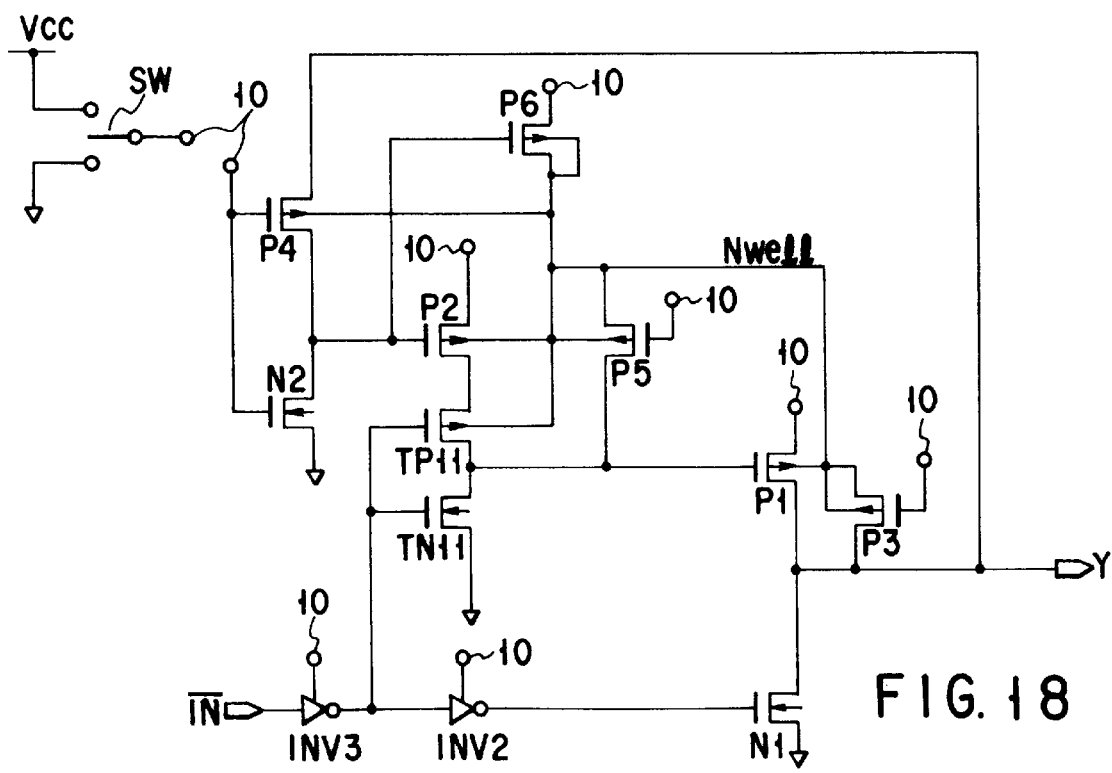
FIG. 18 is a circuit diagram of an output circuit according to an eleventh embodiment of the invention.

FIG. 18 illustrates a bistate buffer which is the eleventh embodiment of the invention. The eleventh embodiment differs from the bistate buffer shown in FIG. 17 (i.e., the tenth embodiment) in that the source-drain path of the PMOS transistor P5 is connected between the back gate N Well and the gate node of the PMOS transistor P1.

How the eleventh embodiment operates while the power-supply node 10 is set at the ground potential will be explained. The output node of the inverter INV3 remains at the ground potential. Since the power-supply potentials of inverters INV3 and INV2 are equal to the ground potential, their output potentials are set at the ground potential. NMOS transistors N1 and TN11 are off. A current flows from neither the output terminal Y nor the gate of the PMOS transistor P1. When a potential Vy higher than the ground potential is applied to the output terminal Y, it is transferred to the drain of the PMOS transistor P1, as in the second embodiment (FIG. 9). No current path is formed which extends from the output terminal Y to the power-supply node 10 set at the ground potential. The eleventh embodiment, therefore, has the same advantage and the same disadvantage as the second embodiment shown in FIG. 9.

Figure 19:
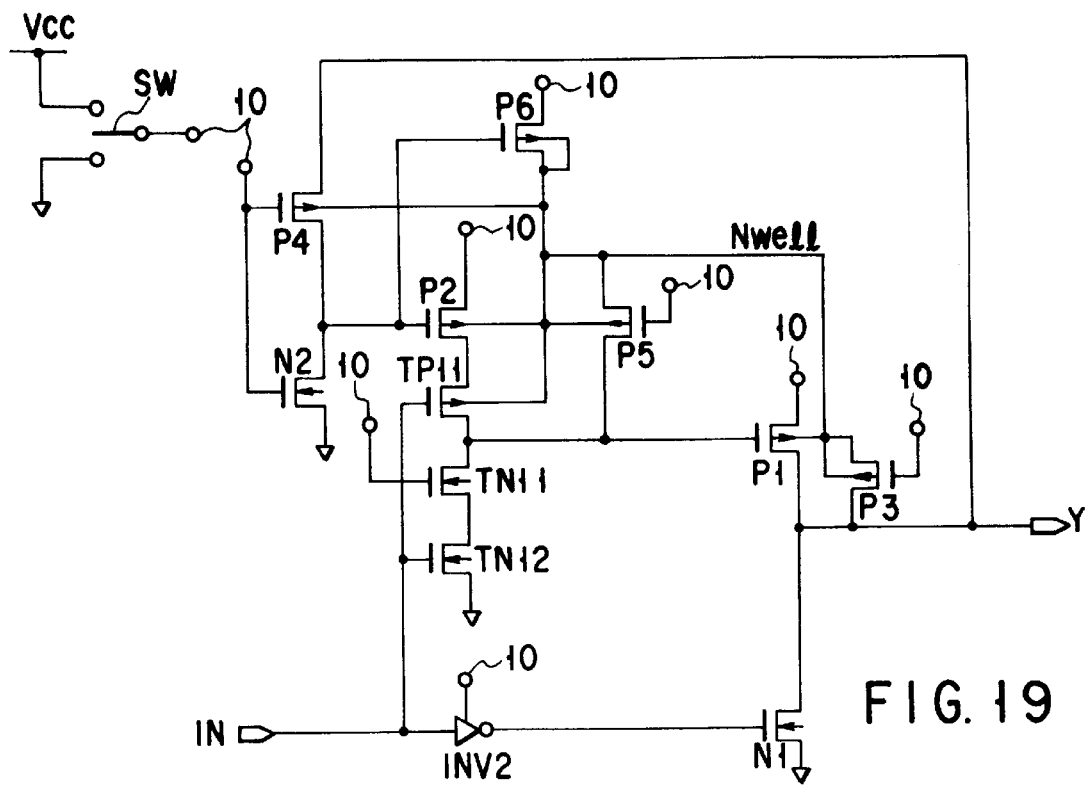
FIG. 19 is a circuit diagram of an output circuit according to a twelfth embodiment of the invention.

FIG. 19 shows a bistate buffer according to the twelfth embodiment of the invention. This bistate buffer differs from the eleventh embodiment shown in FIG. 18 in two respects. First, it receives an input signal IN, not an input signal /IN and has no inverter equivalent to the inverter INV 3. Second, the drain-source path of an NMOS transistor TN12 is connected between the source and ground-potential node of an NMOS transistor TN11. The gate of the NMOS transistor TN11 is connected to the power-supply node 10, and the gate of the NMOS transistor TN12 is connected to receive the input signal IN.

How the twelfth embodiment operates when the power-supply node 10 is set at the ground potential will be explained. The input signal IN is not an output signal of a circuit whose power-supply potential is Vcc. It may be a potential equal to or higher than the ground potential even if the power-supply node 10 is set at the ground potential. The gate of the PMOS transistor TP11 and the gate of the NMOS transistor TN12 cannot be assumed to be set at the ground potential. Thus, the PMOS transistor P5 cannot be connected at one end to the gate of the PMOS transistor P1. Since the NMOS transistor TN12 may be turned on even if the node 10 is set at the ground potential, the NMOS transistor TN11 is used. The transistor TN11 reliably remains off as long as the node 10 remains at the ground potential, because its gate is connected to the power-supply node 10 which is set at the ground potential.

Figure 20:
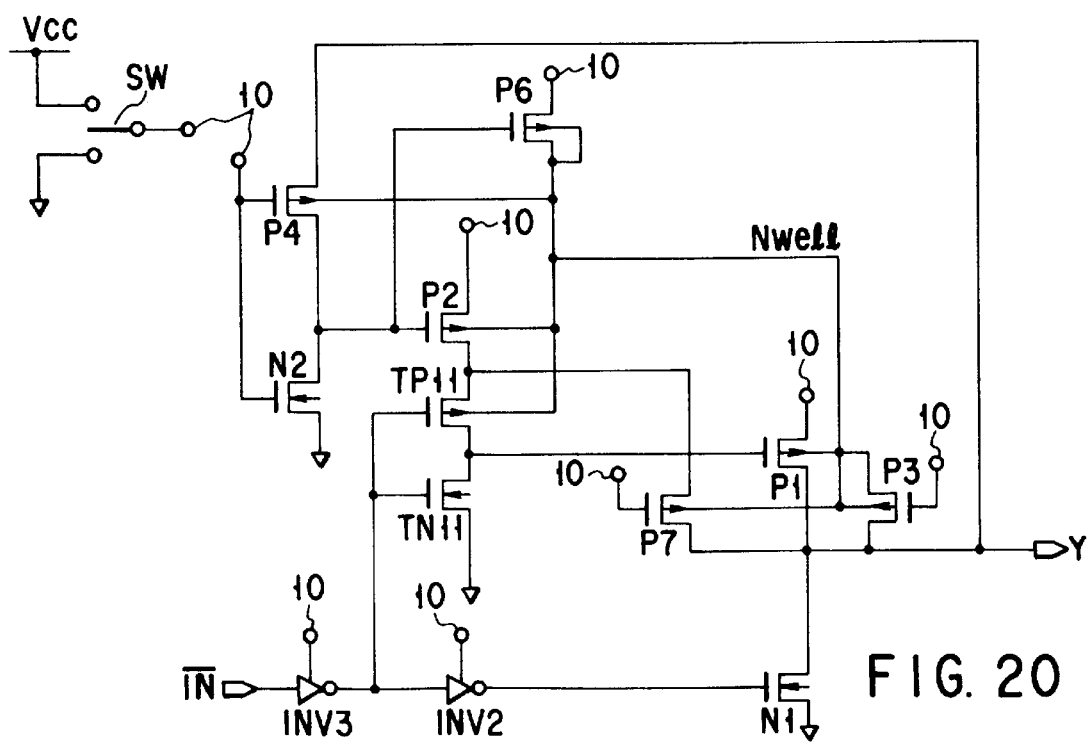
FIG. 20 is a circuit diagram of an output circuit according to a thirteenth embodiment of the invention.

FIG. 20 illustrates a bistate buffer according to the thirteenth embodiment of the present invention. The thirteenth embodiment differs from the tenth embodiment shown in FIG. 17 in that a PMOS transistor P7 is used in place of the PMOS transistor P5. The source-drain path of the PMOS transistor P7 is connected between the output terminal Y and the drain of the PMOS transistor P2. The gate of the PMOS transistor P7 is connected to the power-supply node 10.

As long as the node 10 is connected to the ground-potential node, the potential at the output terminal Y is transferred to the gate of the PMOS transistor P1 through the PMOS transistors P7 and TP11 when a potential higher than the ground potential is applied to the output terminal Y—not through the PMOS transistors P3, P5 and TP11 as in the tenth embodiment (FIG. 17).

Figure 21:
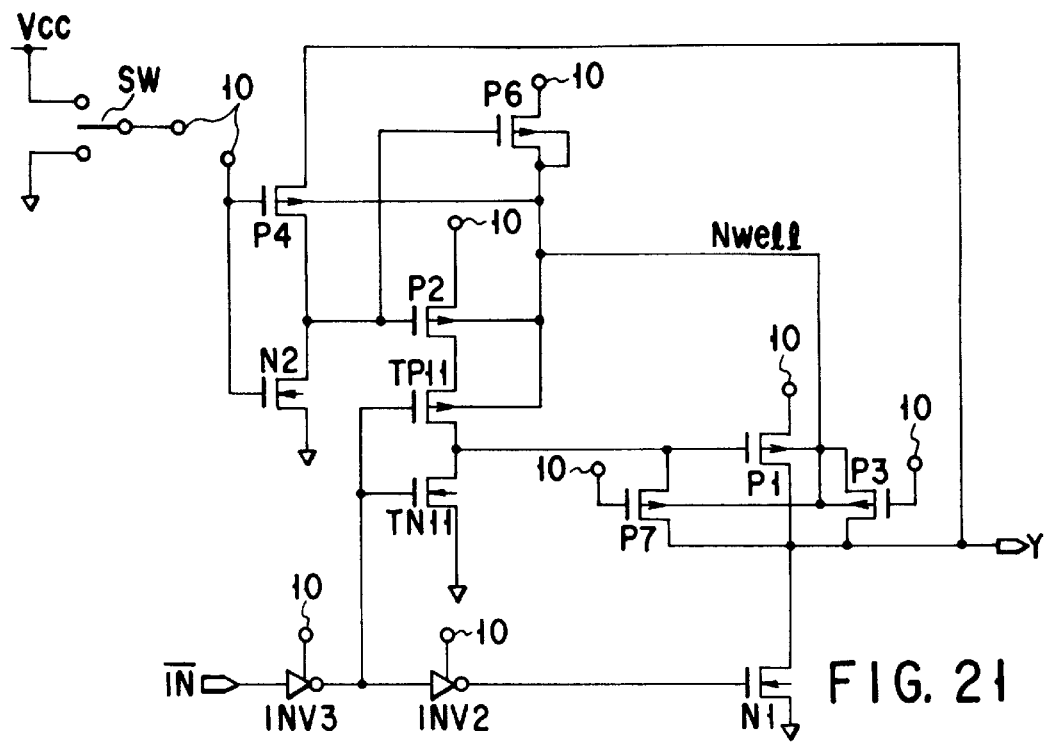
FIG. 21 is a circuit diagram of an output circuit according to a fourteenth embodiment of the invention.

FIG. 21 illustrates a bistate buffer which is the fourteenth embodiment of the invention. The fourteenth embodiment differs from the thirteenth embodiment shown in FIG. 20 in that the source-drain path of the PMOS transistor P7 is connected between the output terminal Y and the gate of the PMOS transistor P1.

As long as the node 10 is connected to the ground-potential node, the potential at the output terminal Y is transferred to the gate of the PMOS transistor P1 through only the PMOS transistor P7 when a potential higher than the ground potential is applied to the output terminal Y—not through the PMOS transistor P7 and also through the PMOS transistor TP11 as in the thirteenth embodiment (FIG. 20). The potential is transferred even faster, and the PMOS transistor P1 is turned off more quickly. This decreases the transient current flowing from the output terminal Y to the ground potential terminal, but increases the load capacitance parasitic to the gate of the PMOS transistor P1. Consequently, the signal at the gate node of the transistor P1 may swing more slowly. Furthermore, the current consumed increases by the current charged and discharged as the parasitic capacitance of the gate of the PMOS transistor P1 increases. This is inevitable because the signal at the gate node of the transistor P1 swings fully during normal operation of the circuit, whereas the signal at the drain of the PMOS transistor P2 swings but a little.

Figure 22:
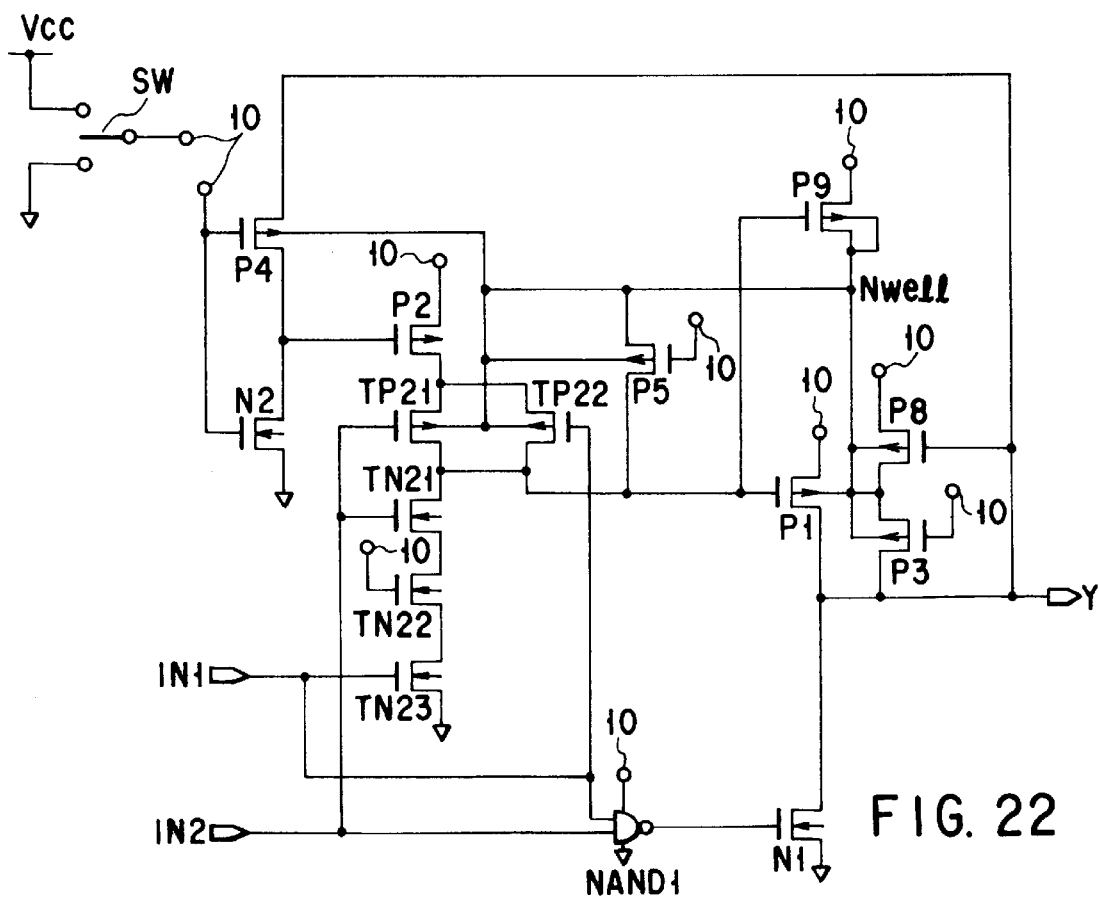
FIG. 22 is a circuit diagram of an output circuit according to a fifteenth embodiment of the invention.

FIG. 22 illustrates a bistate buffer which is the fifteenth embodiment of the invention. This embodiment is a two-input AND logic circuit which receives two input signals IN1 and IN2. The source-drain paths of PMOS transistors TP21 and TP22 are connected in parallel between the drain of the PMOS transistor P2 and the gate of the PMOS transistor P1 included in the output section. The source-drain paths of three NMOS transistors TN21, TN22 and TN23 are connected in series between the gate of the PMOS transistor P1 and the ground-potential node. The gates of the PMOS transistor TP21 and NMOS transistor TN21 are connected to receive the input signal IN2, and the gates of the PMOS transistor TP22 and NMOS transistor TN23 are connected to receive the input signal IN1. The gate of the NMOS transistor TN22 is connected to the power-supply node 10.

The NMOS transistor TN22 must be connected in series to the NMOS transistors TN21 and TN23, between the gate of the PMOS transistor P1 and the ground-potential node. When the power-supply node 10 is connected to the ground-potential node, applying the potential at the power-supply node 10 to the gate of the NMOS transistor TN22, the NMOS transistor TN22 is turned off. As a result, the current path extending from the gate node of the transistor P1 to the ground-potential node ceases to exist.

PMOS transistors P8 and P9 are provided for the same reason as in the ninth embodiment shown in FIG. 16. All other MOS transistors shown in FIG. 22 operate in the same way as their counterparts of the first embodiment illustrated in FIG. 7.

The fifteenth embodiment (FIG. 22), which is a two-input AND circuit, may be modified to receive three or more input signals.

FIG. 23 shows an output circuit according to the sixteenth embodiment of the invention, which has M input terminals for receiving M input signals IN1 to INM. The sixteenth embodiment comprises a CMOS circuit 30 which is a multi-input logic circuit. The CMOS circuit 30 comprises the PMOS circuit 31 and an NMOS circuit 32. The PMOS circuit 31 includes PMOS transistors only, such as PMOS transistors TP21, TP22 and P2. The NMOS circuit 22 includes NMOS transistors only, such as TN21 to TN23.

The sixteenth embodiment further comprises another CMOS circuit 33, which corresponds to the NAND circuit NAND1 incorporated in the fifteenth embodiment shown in FIG. 22. It receives M input signals IN1 to INM and generates an output signal, which controls the gate of the NMOS transistor N1 provided in the output section of the sixteenth embodiment. The source-drain path of the NMOS transistor N1 has one end connected directly to the gate of the PMOS transistor P1 provided in the output section, as in the fifteenth embodiment illustrated in FIG. 22.

Figure 24:
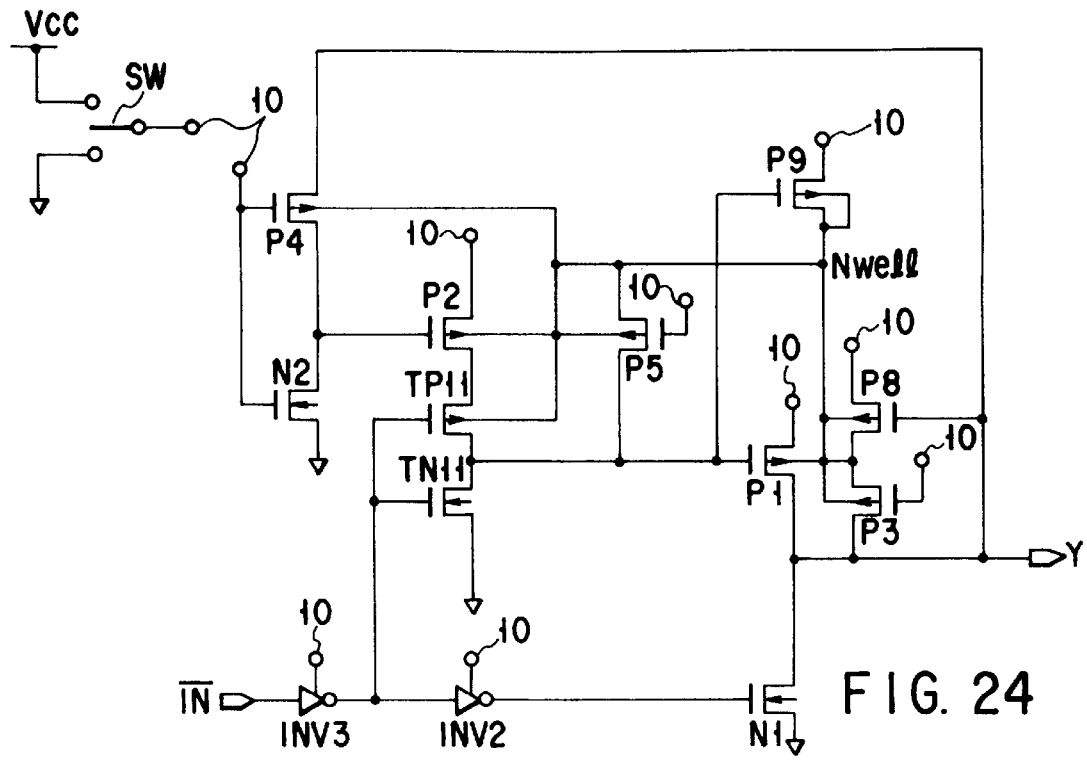
FIG. 24 is a circuit diagram of an output circuit according to a seventeenth embodiment of the invention.

FIG. 24 shows a bistate buffer which is the seventeenth embodiment of the present invention. This bistate buffer differs from the eleventh embodiment illustrated in FIG. 18 in that two PMOS transistors P8 and P9 are used, replacing the PMOS transistor P6. The PMOS transistors P8 and P9 cooperate to pull up the potential of the Nwell during the normal operation of the buffer, that is, while the power-supply potential Vcc is being applied to the power-supply node 10, whereas in the eleventh embodiment the PMOS transistor P6 pulls up the potential of the Nwell to the power-supply potential Vcc. Stated more precisely, as long as the gate of the PMOS transistor P1 remains at the ground potential, the PMOS transistor P1 is on, and the PMOS transistor P9 is also on, pulling up the potential of the Nwell.

On the other hand, when the gate of the PMOS transistor P1 is at the power-supply potential Vcc, the PMOS transistor P1 and the NMOS transistor N1 are off and on, respectively. Therefore, the output terminal Y is on, pulling up the potential of the Nwell. The MOS transistors other than the transistors P8 and P9 operate in the same way as their counterparts of the eleventh embodiment shown in FIG. 18. It should be noted that the PMOS transistors P8 and P9 are off since their gate potential is higher than their source potential as long as the power-supply node 10 is connected to the ground-potential node and the output terminal Y is set at a potential higher than the ground potential.

According to the present invention, PMOS transistors P8 and P9 may be used to substitute for the PMOS transistor P6 so as to pull up the potential of the Nwell—also in the embodiments other than the eleventh embodiment illustrated in FIG. 18.

Figure 25:
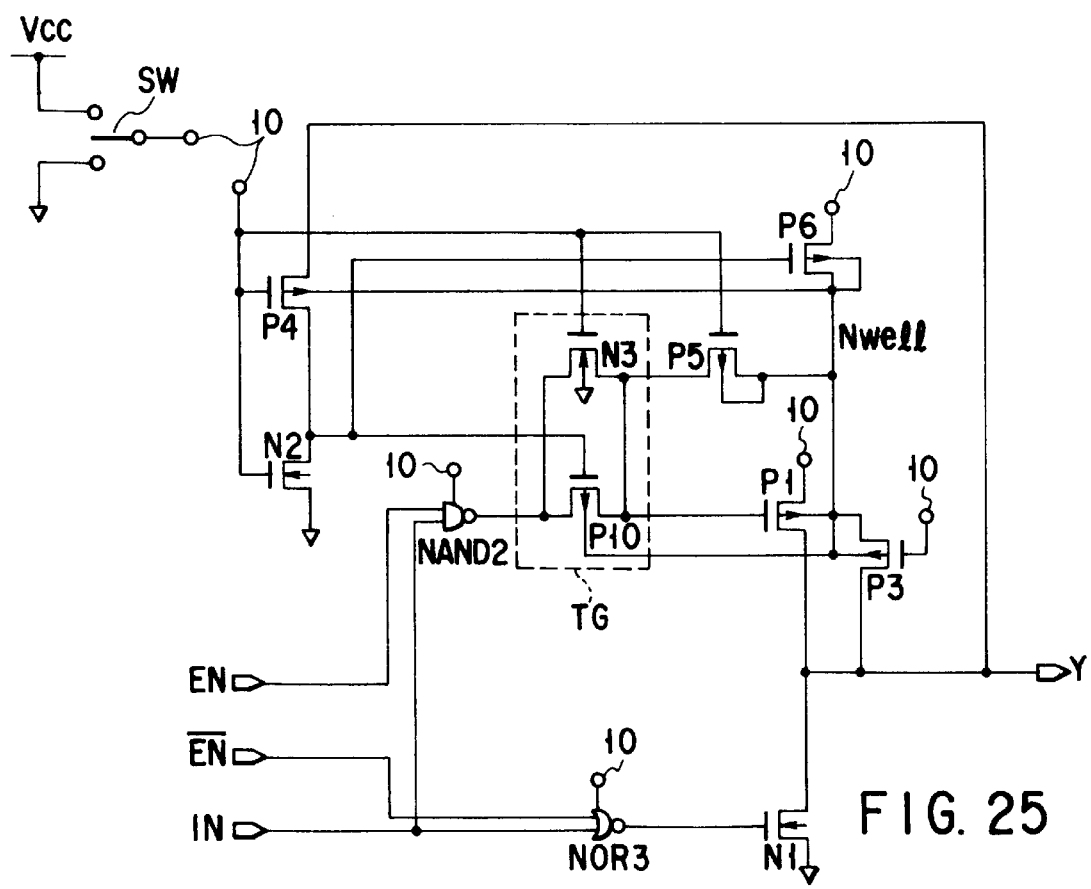
FIG. 25 is a circuit diagram of an output circuit according to an eighteenth embodiment of the invention.

FIG. 25 shows a tristate buffer which is the eighteenth embodiment of the present invention. This tristate buffer is similar in basic structure to the conventional output circuit shown in FIG. 5. More specifically, its output section comprises a PMOS transistor P1, an NMOS transistor N1, and means for generating signal for controlling both MOS transistors P1 and N1. The signal-generating means is constituted by a NAND circuit NAND2, a NOR circuit NOR3 and a transfer gate, and the like. The transistors P1 and N1 have their drains connected to the output terminal Y, and the source of the NMOS transistor N1 is connected to the ground-potential node.

As shown in FIG. 25, a PMOS transistor P10 and an NMOS transistor N3 have their source-drain paths connected in parallel, constituting a transfer gate TG. An input signal IN and an enable signal EN are supplied to the NAND circuit NAND2. The output of the NAND circuit NAND2 is supplied to the gate of the PMOS transistor P1 through the transfer gate TG. A PMOS transistor P4 and an NMOS transistor N2 constitute a circuit, the output of which is supplied to the gate of a PMOS transistor P10, thereby controlling the transfer gate TG. The potential at the power-supply node 10 is applied to the gate of the NMOS transistor N3. The input signal IN and an enable signal /EN are supplied to the NOR circuit NOR3, the output of which is transferred to the gate of the NMOS transistor N1 incorporated in the output section.

Applied as power-supply potential to the NAND circuit NAND2 and the NOR circuit NOR3 is the potential at the power-supply node 10.

Connected between the back gate of the PMOS transistor P1 and the output terminal Y is the source-drain path of the PMOS transistor P3. The gate of the PMOS transistor P3 is connected to the power-supply node 10. A PMOS transistor P5 has its source-drain path connected between the back gate and gate of the PMOS transistor P1. The gate of the PMOS transistor P5 is connected to the power-supply node 10. The source-drain path of a PMOS transistor P6 is connected between the power-supply node 10 and the back gate of the PMOS transistor P1.

How the eighteenth embodiment operates while the power-supply node 10 is set at the power-supply potential Vcc will be explained. The PMOS transistors P3, P5 and P4 are off because the potential Vcc is applied to their gates. The NMOS transistors N2 and N3 are off because the potential Vcc is applied also to their gates. Hence, the gates of the PMOS transistors P6 and P10 are pulled down to the ground potential, whereby both PMOS transistors are turned on. As the PMOS transistor P6 is turned on, the back gates Nwell of all PMOS transistors are pulled up to the power-supply potential Vcc. As the PMOS transistor P10 is turned on, the transfer gate TG comprised of the PMOS transistor P10 and the NMOS transistor N3 becomes able to transfer the output of the NAND circuit NAND2 to the gate of the PMOS transistor P1. Thus, the eighteenth embodiment operates in the same way as an ordinary tristate buffer as long as the power-supply node 10 is set at the power-supply potential Vcc.

It will now be explained how the eighteenth embodiment operates while the power-supply node 10 is set at the ground potential. Assume that this circuit is connected by a bus line to another output circuit as the conventional output circuit shown in FIG. 4, and that the other output circuit outputs a potential Vy (e.g., a Vcc-level potential) which is higher than the ground potential. In this case, a potential higher than the ground potential is applied to the output terminal Y.

Figure 1:
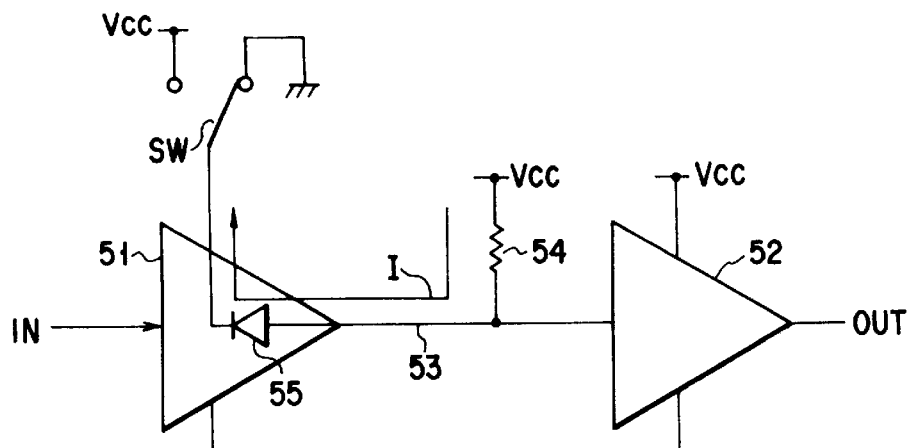
FIG. 1 is a circuit diagram showing two conventional output circuits connected, independently driven by two respective power supplies.
Figure 2:
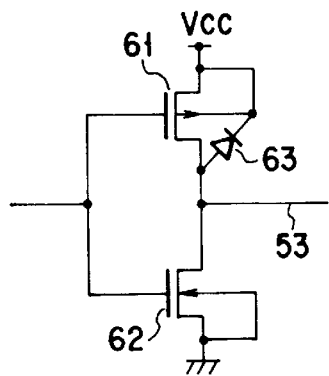
FIG. 2 is a circuit diagram of one of the output circuits shown in FIG. 1.
Figure 3:
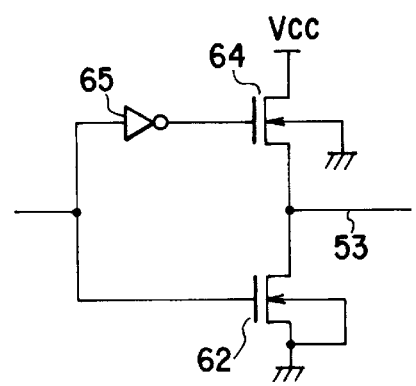
FIG. 3 is a circuit diagram illustrating a modification of the output circuit shown in FIG. 2.
Figure 4:
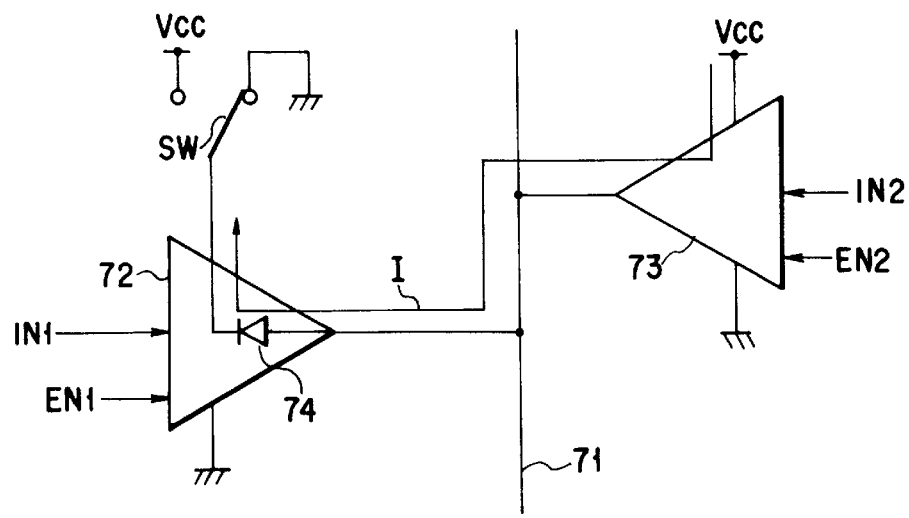
FIG. 4 is a circuit diagram showing two conventional output circuits connected, used in bus-line application.

In the conventional circuit shown in FIG. 4, a large current inevitably flows to the conventional circuit (FIG. 4) from the power-supply node of the other circuit through the bus line and the output terminal Y. In the eighteenth embodiment (FIG. 25), the gates of the PMOS transistors P3, P5 and P4 and the gates of the NMOS transistors N2 and N3 are at the ground potential, Therefore, the PMOS transistors P3, P5 and P4 are on, while the NMOS transistors N2 and N3 are off. If Vy>|Vtp(P4)|, the gate potentials of the PMOS transistors P6 and P10 are equal to the potential at the output terminal Y, i.e., the potential Vy, since the PMOS transistor P4 and NMOS transistor N2 are on and off, respectively.

If Vy>|Vtp(P3)|, the PMOS transistor P3 is on, whereby the potential of the Nwell is equal to the potential at the output terminal Y, i.e., potential Vy. Nonetheless, the pn-junction diode formed between the output terminal Y and the back gate of the PMOS transistor P1 can transfer a potential almost equal to the potential at the terminal Y to the back gate of the PMOS transistor P1.

If Vy>|Vtp(P5)|, the PMOS transistor P5 is on, whereby the potential at its back gate Nwell is transferred to the gate of the PMOS transistor P1. As a result, the gate-source potential differences of the PMOS transistors P1, P6 and P10 cease to exist, and these PMOS transistors are turned off.

Furthermore, the power-supply potential and output potential of the NOR circuit NOR3 are set at the ground potential. The NMOS transistor N1 is therefore off. Therefore, no current flows from the output terminal Y to the ground-potential node.

Thus, the potential of the output terminal Y can fully swing between the ground potential and the power-supply potential Vcc as long as the potential Vcc is applied to the power-supply node 10 through the switch SW. Even when the power-supply node 10 is set at the ground potential, no current flows from the output terminal Y to the ground-potential node.

Figure 26:
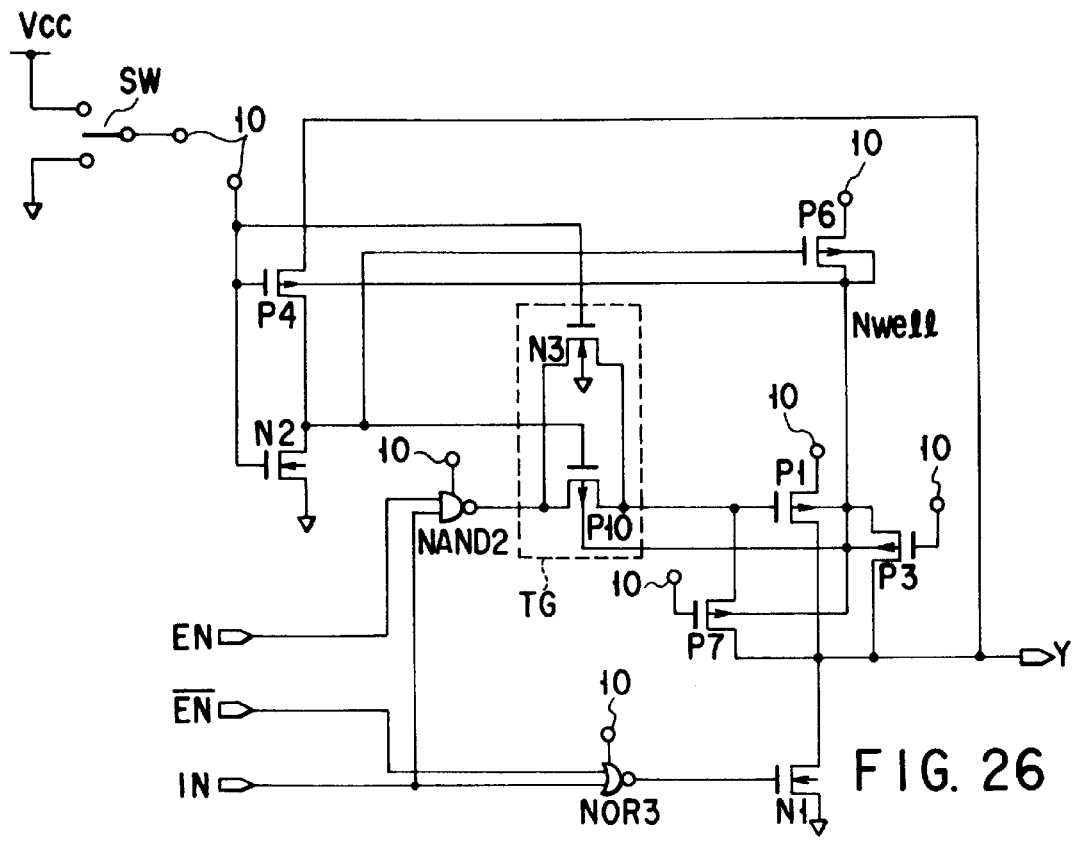
FIG. 26 is a circuit diagram of an output circuit according to a nineteenth embodiment of the invention.

FIG. 26 shows a tristate buffer which is the nineteenth embodiment of the present invention. This tristate buffer is different from the eighteenth embodiment shown in FIG. 25 in that a PMOS transistor P7 is used in place of the PMOS transistor P5. The PMOS transistor P7 is connected between the output terminal Y and the gate of the PMOS transistor P1, as in the bistate buffer shown in FIG. 21 which is the fourteenth embodiment.

When a potential higher than the ground potential is applied to the output terminal Y while the node 10 remains at the ground potential, the potential at the terminal Y is transferred to the gate of the PMOS transistor P1 via PMOS transistor P7 only. (In the eighteenth embodiment (FIG. 25), the potential is supplied to the gate of the transistor P1, first through the PMOS transistor P3 and then the PMOS transistor P5.) Hence, the potential is applied faster than in the eighteenth embodiment, and the PMOS transistor P1 is turned off more quickly. The transient current flowing from the output terminal Y to the ground potential terminal therefore decreases.

Figure 27:
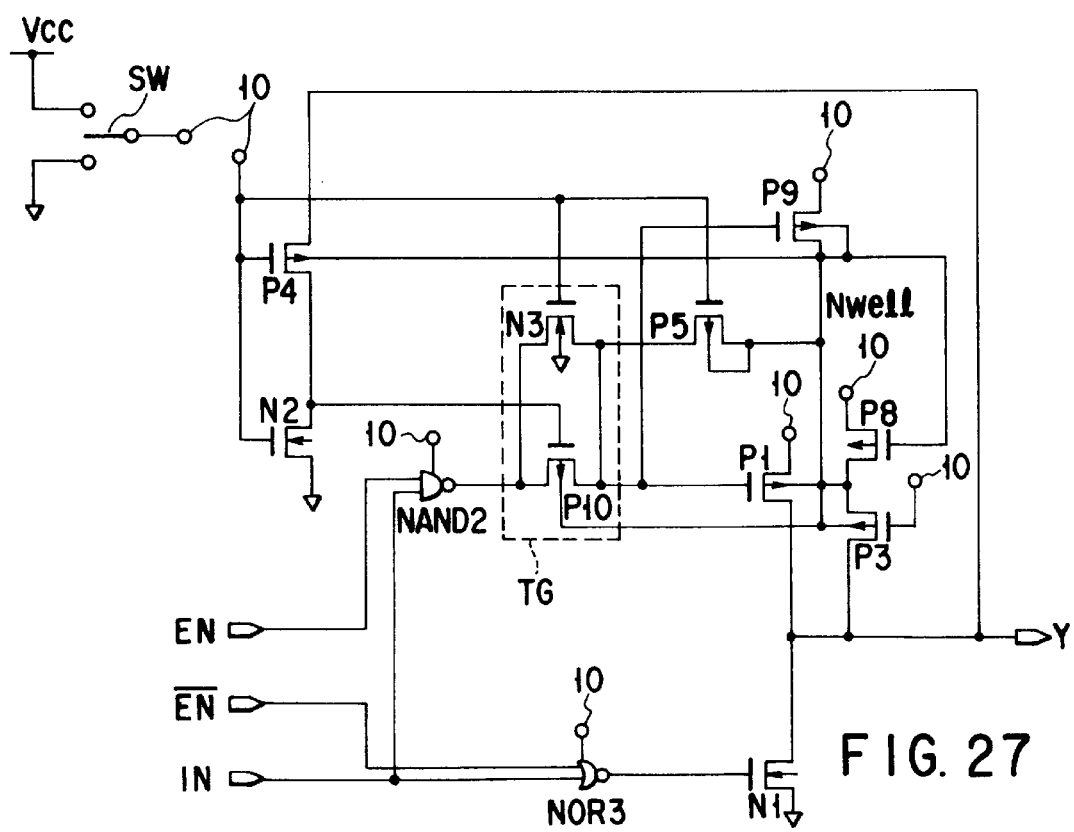
FIG. 27 is a circuit diagram of an output circuit according to a twentieth embodiment of the invention.

FIG. 27 illustrates a tristate buffer which is the twentieth embodiment of the invention. The twentieth embodiment differs from the nineteenth embodiment shown in FIG. 26 in the means employed to pull up the node of the Nwell to the power-supply potential Vcc. More specifically, PMOS transistors P8 and P9 are used, replacing the PMOS transistor P6, as in the bistate buffer shown in FIG. 14 which is the seventeenth embodiment.

When the power-supply node 10 is set at the power-supply potential Vcc, the PMOS transistors P8 and P9 cooperate to pull up the Nwell to the power-supply potential Vcc, whereas the PMOS transistor P6 pulls up the Nwell to the power-supply potential Vcc in the nineteenth embodiment shown in FIG. 26. That is, as long as the gate of the PMOS transistor P1 remains at the power-supply potential, the PMOS transistor P1 is on, and the PMOS transistor P9 is also on, which pulls up the Nwell to the power-supply potential Vcc.

All MOS transistors, but the PMOS transistors P8 and P9, operate in the same way as their counterparts of the eighteenth embodiment illustrated in FIG. 25. It should be noted that the PMOS transistors P8 and P9 are off since their gate potential is higher than their source potential as long as the power-supply node 10 is connected to the ground-potential node and the output the PMOS transistor P9 is off for the same reason as the PMOS transistor P1 is off.

Figure 28:
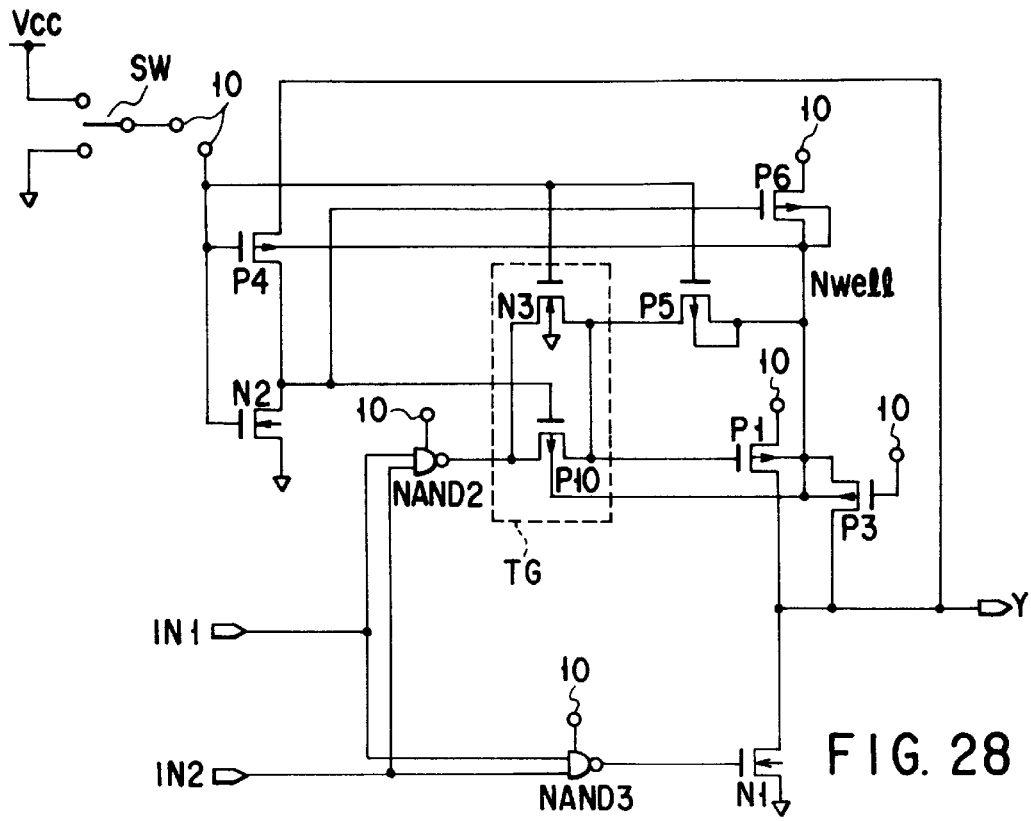
FIG. 28 is a circuit diagram of an output circuit according to a twenty-first embodiment of the present invention.

FIG. 28 illustrates a bistate buffer which is the twenty-first embodiment of the present invention. This bistate buffer is a two-input AND circuit which receives two input signals IN1 and IN2. It differs from the tristate buffer shown in FIG. 25, i.e., the eighteenth embodiment, in two respects. First, a NAND circuit NAND3 replaces the NOR circuit NOR3, to receive the input signals IN1 and IN2. Second, the input signals IN1 and IN2 are supplied to the NAND circuit NAND2, instead of the enable signal EN and the input signal IN. In all other structural features the twenty-first embodiment is identical to the eighteenth embodiment (FIG. 25).

How the twenty-first embodiment operates may be easily understood from the operation of the eighteenth embodiment (FIG. 25) since the former differs from the latter only in that the NAND circuit NAND 3 replaces the NOR circuit NOR3.

The twenty-first embodiment, which is a two-input AND circuit, may be modified into a multi-input bistate buffer, by replacing the NAND circuits NAND2 and NAND3 with other logic circuits. Such a multi-input bistate buffer can generate outputs of different logic values.

Figure 29:
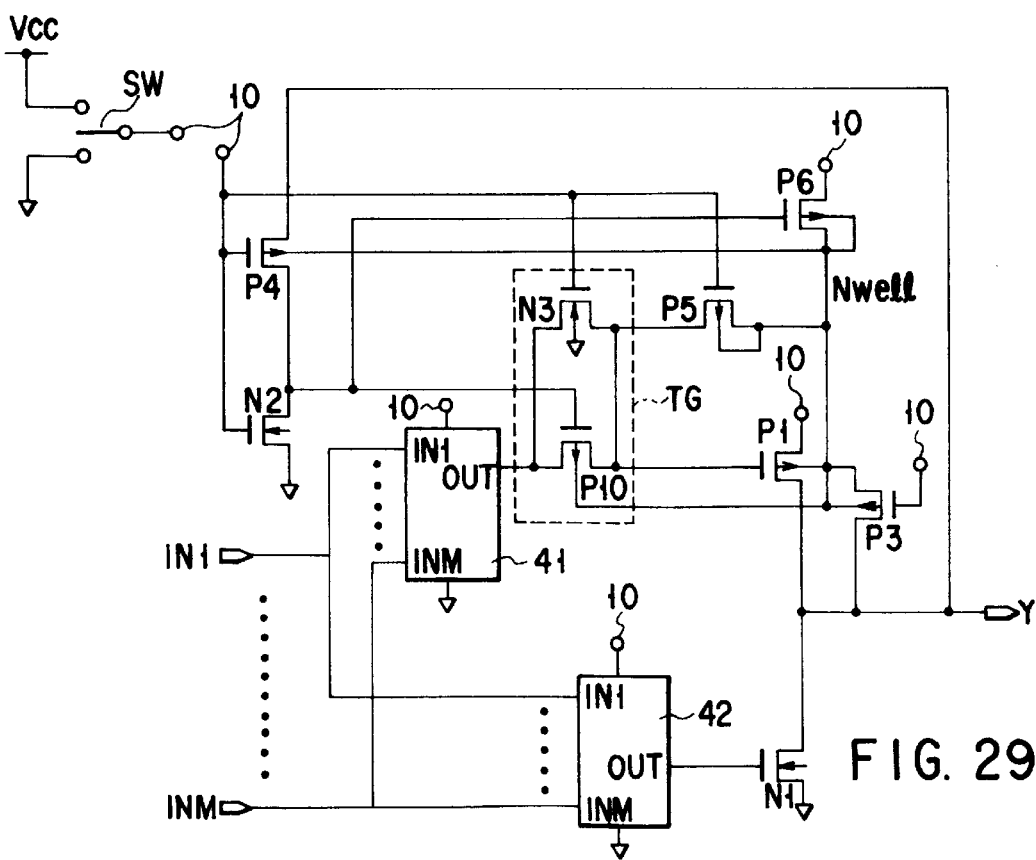
FIG. 29 is a circuit diagram of an output circuit according to a twenty-second embodiment of the present invention.

FIG. 29 illustrates a bistate buffer which is the twenty-second embodiment of the invention. The twenty-second embodiment is designed to receive M input signals IN1 to INM. The twenty-second embodiment comprises a CMOS logic circuit 41, which replaces the NAND circuit NAND2 incorporated in the twenty-first embodiment shown in FIG. 28. The output of the CMOS logic circuit 41 is supplied to the gate of the PMOS transistor P1 provided in the output section, through a transfer gate TG comprised of a PMOS transistor P10 and an NMOS transistor N3. The twenty-second embodiment further comprises a CMOS logic circuit 42. The CMOS logic circuit 42 is an M-input logic circuit, used in place of the NAND circuit NAND3 shown in FIG. 28. The output of the CMOS logic circuit 42 is supplied to the gate of the NMOS transistor N1 provided in the output section. Except for the CMOS logic circuits 41 and 42, the twenty-second embodiment is identical in structure to the twenty-first embodiment shown in FIG. 28.

The CMOS logic circuits 41 and 42 may be of any logic architecture desired. Obviously, the bistate buffer according to the twenty-second embodiment can output any logic values desired.

FIG. 30 illustrates a multi-input output circuit according to the twenty-third embodiment of the present invention.

This circuit differs from the twenty-second embodiment (FIG. 29) in that PMOS transistors P8 and P9 are used in place of the PMOS transistor P6, as in the fifteenth embodiment illustrated in FIG. 22.

The present invention is not limited to the embodiments described above. Needless to say, various changes and modifications can be made within the scope of the invention. For example, PMOS transistors P8 and P9 may be used to pull up the potential at the Nwell node, also in the embodiments shown in FIGS. 26 and 28, thereby to modify them into other embodiments.

Further, the NMOS transistor N1 and the circuit for driving this transistor N1 may be removed from the embodiments shown in FIG. 7 and FIGS. 9 to 30, and only the PMOS transistor P1 may be used as a pull-up element.

Still further, in the embodiments shown in FIG. 7 and FIGS. 9 to 30, the Vcc node (i.e., the high-potential node) is short-circuited to the ground-potential node (i.e., the low-potential node), not connected to the ground potential node by the switch SW.

With any embodiment described above, it is possible to swing fully. In the case where the output of the output circuit of any embodiment is terminated at a resistor or is connected to another output circuit, the output can swing fully and an unnecessary current can be prevented from flowing via a parasitic diode from the power-supply node to the ground-potential node even if the power-supply potential of at least one output circuit is lowered to the ground potential.

Since the output of any output circuit according to the present invention can swing fully even if the power-supply potential is applied to the output circuit, the circuit which is connected to receive the output of the output circuit can have a threshold voltage which is at a CMOS level and can, therefore, is resistant to noise.

As has been described, the present invention can provide an output circuit which can generates a sufficiently high potential and which can prevent an unnecessary current from flowing from the power supply to the ground through a parasitic diode even if the output is terminated at a resistor or even if the output circuit is connected to another output circuit and at least one circuit has its power supply connected to the ground.

What is claimed is:

1. An output circuit comprising:
   an output terminal;
   a power-supply node for receiving either a first power-supply potential or a second power-supply potential;
   a first MOS transistor having a source, a drain, a gate connected to receive a control signal, a back gate isolated from the source in terms of potential, and a source-drain path connected between said power-supply node and said output terminal;
   a second MOS transistor of the same channel type as said first MOS transistor, having a source, a drain, a gate and a back gate, and a source-drain path connected between the back gate and gate of said first MOS transistor, and controlled to be off when the first power-supply potential is applied to said power-supply node and to be on when the second power-supply potential is applied to said power-supply node; and
   a third MOS transistor of the same channel type as said first MOS transistor, having a source-drain path connected between said output terminal and the end of the source-drain path of said second MOS transistor which is connected to said back gate of said first MOS transistor.

2. The output circuit according to claim 1, wherein the back gate of said second MOS transistor is connected to the back gate of said first MOS transistor, and the gate of said second MOS transistor is connected to said power-supply node.

3. An output circuit comprising:
   an output terminal;
   a first power-supply node for receiving either a first power-supply potential or a second power-supply potential;
   a second power-supply node for receiving the second power-supply potential;
   a first MOS transistor of a first channel type, having a source, a drain, a gate connected to receive a control signal, a back gate isolated from the source in terms of potential, and a source-drain path connected between said first power-supply node and said output terminal;
   a second MOS transistor of the first channel type, having a source, a drain, a gate connected to said first power-supply node, and a source-drain path connected between the back gate and the gate of said first MOS transistor;
   a third MOS transistor of the first channel type, having a source, a drain, a gate connected to said first power-supply node, and a source-drain path connected at a first end to said output terminal;
   a fourth MOS transistor of a second channel type, having a source, a drain, a gate connected to said first power-supply node, and a source-drain path connected between said second power-supply node and a second end of the source-drain path of said third MOS transistor;
   first control-signal generating circuit for generating the control signal from a first signal and for supplying the control signal to the gate of said first MOS transistor, said first control-signal generating circuit comprising:
      a fifth MOS transistor of the first channel type, having a source, a drain, a gate connected to a node of the source-drain paths of said third and fourth MOS transistors, and a source-drain path connected between said first power-supply node and the gate of said first MOS transistor;
      a sixth MOS transistor of the first channel type, having a source, a drain, a gate for receiving a first signal, and a source-drain path connected in series to the source-drain path of said fifth MOS transistor; and
      a seventh MOS transistor of the second channel type, having a source, a drain, a gate for receiving the first signal, and a source-drain path connected between the gate of said first MOS transistor and said second power-supply node; and
   a second control-signal generating circuit for receiving power-supply voltages which are voltages at said first and second power-supply nodes, and generating the first signal to be supplied to the gates of said sixth and seventh MOS transistors.

4. The output circuit according to claim 3, wherein the source-drain path of said fifth MOS transistor is connected at a first end to said first power-supply node, the source-drain path of said second MOS transistor is connected at a first end to the back gate of said first MOS transistor and at a second end to a second end of the source-drain path of said fifth MOS transistor.

5. The output circuit according to claim 3, wherein the source-drain path of said second MOS transistor is connected at the first end to the back gate of said first MOS transistor and at the second end to the gate of said first MOS transistor.

6. The output circuit according to claim 3, wherein said first control-signal generating circuit comprises an eighth MOS transistor of the second channel type, having a source, a drain, a gate connected to said first power-supply node, and a source-drain path connected between the gate of said first MOS transistor and said second power-supply node and in series to the source-drain path of said seventh MOS transistor.

7. The output circuit according to claim 3, further comprising an eighth MOS transistor of the first channel type, having a source, a drain, a gate connected to said first power-supply node, and a source-drain path connected between the back gate of said first MOS transistor and said output terminal.

8. The output circuit according to claim 3, further comprising an eighth MOS transistor of the first channel type, having a source, a drain, a gate connected to a node of the source-drain paths of said third and fourth MOS transistors, and a source-drain path connected between said first power-supply node and the back gate of said first MOS transistor.

9. The output circuit according to claim 3, further comprising:
an eighth MOS transistor of the second channel type, having a source, a drain, a gate, and a source-drain path connected between said output terminal and said second power-supply node; and
a third control-signal generating circuit for receiving voltage at said first power-supply node and voltage at said second power-supply node and for generating a control signal to be supplied to the gate of said eighth MOS transistor.

10. The output circuit according to claim 3, further comprising:
an eighth MOS transistor of the first channel type, having a source, a drain, a gate connected to the gate of said first MOS transistor, and a source-drain path connected between said first power-supply node and the back gate of said first MOS transistor; and
a ninth MOS transistor of the first channel type, having a source, a drain, a gate connected to said output terminal and a source-drain path connected between said first power-supply node and the back gate of said first MOS transistor.

11. An output circuit comprising:
an output terminal;
a first power-supply node for receiving either a first power-supply potential or a second power-supply potential;
a second power-supply node for receiving the second power-supply potential;
a first MOS transistor of a first channel type, having a source, a drain, a gate connected to receive a control signal, a back gate isolated from the source in terms of potential, and a source-drain path connected between said first power-supply node and said output terminal;
a second MOS transistor of the first channel type, having a source, a drain, a gate, a source-drain path connected between the back gate and gate of said first MOS transistor;
a third MOS transistor of the first channel type, having a source, a drain, a gate connected to said first power-supply node, and a source-drain path connected at a first end to said output terminal;
a fourth MOS transistor of a second channel type, having a source, a drain, a gate connected to said first power-supply node, and a source-drain path connected between said second power-supply node and a second end of the source-drain path of said third MOS transistor;
a first control-signal generating circuit for generating the control signal from a plurality of signals and for supplying the control signal to the gate of said first MOS transistor, said first control-signal generating circuit comprising:
a fifth MOS transistor of the first channel type, having a source, a drain, a gate connected to a node of the source-drain paths of said third and fourth MOS transistors, and a source-drain path connected between said first power-supply node and the gate of said first MOS transistor;
a plurality of sixth MOS transistors of the first channel type, each having a source, a drain, a gate for receiving one of said plurality of signals, and a source-drain path connected between said first power-supply node and the gate of said first MOS transistor and in series to the source-drain path of said fifth MOS transistor; and
a plurality of seventh MOS transistors of the second channel type, each having a source, a drain, a gate for receiving one of said plurality of signals, and a source-drain path connected in series between the gate of said first MOS transistor and said second power-supply node; and
a second control-signal generating circuit for receiving power-supply voltages which are voltages at said first and second power-supply nodes, and generating any one of said plurality signals to be supplied to the gates of said sixth and seventh MOS transistors.

12. The output circuit according to claim 11, wherein the source-drain path of said second MOS transistor is connected at a first end to the back gate of said first MOS transistor and at a second end to the gate of said first MOS transistor.

13. The output circuit according to claim 11, wherein the source-drain path of said second MOS transistor is connected at a first end to the back gate of said first MOS transistor and at a second end to a first end of the source-drain path of said fifth MOS transistor, which is closer to the gate of said first MOS transistor than a second end.

14. The output circuit according to claim 11, further comprising an eighth MOS transistor of the first channel type, having a source, a drain, a gate connected to said first power-supply node, and a source-drain path connected between said output terminal and the back gate of said first MOS transistor.

15. The output circuit according to claim 11, further comprising an eighth MOS transistor of the first channel type, having a source, a drain, a gate connected to a node of the source-drain paths of said third and fourth MOS transistors, and a source-drain path connected between said first power-supply node and the back gate of said first MOS transistor.

16. The output circuit according to claim 11, further comprising:
an eighth MOS transistor of the second channel type, having a source, a drain, a gate, and a source-drain path connected between said output terminal and said second power-supply node; and
a third control-signal generating circuit for receiving power-supply voltages which are voltages at said first power-supply node and said second power-supply node, and for generating a control signal in response to said plurality of signals and supplying the control signal to the gate of said eighth MOS transistor.

17. The output circuit according to claim 11, further comprising:

an eighth MOS transistor of the first channel type, having a source, a drain, a gate connected to the gate of said first MOS transistor, and a source-drain path connected between said first power-supply node and the back gate of said first MOS transistor; and a ninth MOS transistor of the first channel type, having a source, a drain, a gate connected to said output terminal, and a source-drain path connected between the first power-supply node and the back gate of said first MOS transistor.

18. An output circuit comprising:

an output terminal;

a first power supply node for receiving either a first power supply potential or a second power supply potential;

a second power supply node for receiving the second power supply potential;

a first MOS transistor of a first channel type, having a source, a drain, a gate coupled to receive a first control signal, a back gate isolated from the source in terms of potential, and a source-drain path coupled between said first power supply node and said output terminal;

a second MOS transistor of the first channel type, having a source, a drain, a gate coupled to said first power supply node, and a source-drain path coupled between the back gate and the gate of said first MOS transistor;

a third MOS transistor of the first channel type, having a source, a drain, a gate coupled to said first power supply node, and a source-drain path coupled at a first end to said output terminal;

a fourth MOS transistor of a second channel type, having a source, a drain, a gate coupled to said first power supply node, and a source-drain path coupled between said second power supply node and a second end of the source-drain path of said third MOS transistor; and a first control signal generating circuit coupled to said third and fourth MOS transistors for generating the first control signal and supplying the first control signal to the gate of said first MOS transistor.

19. The output circuit according to claim 18, further comprising:

a second control signal generating circuit for generating second control signals from power supply voltages and supplying the second control signals to said first control signal generating circuit.

* * * * *